(12) United States Patent
Yan

(10) Patent No.: US 8,816,369 B2
(45) Date of Patent: Aug. 26, 2014

(54) LED PACKAGES WITH MUSHROOM SHAPED LENSES AND METHODS OF MANUFACTURING LED LIGHT-EMITTING DEVICES

(75) Inventor: Xiantao Yan, Palo Alto, CA (US)

(73) Assignee: Led Engin, Inc., San Jose, CA (US)

( * ) Notice: Subject to any disclaimer, the term of this patent is extended or adjusted under 35 U.S.C. 154(b) by 0 days.

(21) Appl. No.: 11/796,240

(22) Filed: Apr. 27, 2007

(65) Prior Publication Data

US 2007/0241357 A1    Oct. 18, 2007

Related U.S. Application Data

(63) Continuation-in-part of application No. 11/260,101, filed on Oct. 26, 2005, now Pat. No. 7,670,872.

(60) Provisional application No. 60/623,266, filed on Oct. 29, 2004, provisional application No. 60/623,171, filed on Oct. 29, 2004, provisional application No. 60/623,260, filed on Oct. 29, 2004.

(51) Int. Cl.
*H01L 29/22* (2006.01)

(52) U.S. Cl.
USPC ............... 257/98; 257/88; 257/99; 257/100; 257/E33.059

(58) Field of Classification Search
CPC ....... H01L 33/56; H01L 33/58; H01L 23/315; H01L 25/167; H01L 27/14618; H01L 27/1462; H01L 27/14643; H01L 33/52; H01L 33/642; H01L 2924/12041; H01L 29/78603; H01L 31/0203
USPC .............. 257/79–84; 256/98–103, 88–93, 256/E33.059
See application file for complete search history.

(56) References Cited

U.S. PATENT DOCUMENTS 3,762,038 A * 10/1973 Ruggiero ................. 438/21
5,742,120 A    4/1998 Lin
(Continued)

FOREIGN PATENT DOCUMENTS

JP    H9-321341    12/1997
JP    H11-298035   10/1999
(Continued)

OTHER PUBLICATIONS

"Solvent Soluble Polyimide with High Transparency and high Tg: HOP-400, 500", Hitachi Cable Review, Aug. 2003, No. 22, p. 78.
(Continued)

*Primary Examiner* — H Tsai
(74) *Attorney, Agent, or Firm* — Kilpatrick Townsend & Stockton LLP

(57) ABSTRACT

Methods of fabricating a light-emitting device are provided. A light-emitting device can be formed from bonding a lens including a plug and a cap to an LED package including a socket configured to receive the plug. The lens can be fabricated using an injection mold formed from a well secured to the LED package and injecting a material into the injection mold to cure into a shape of the lens. The lens can also be fabricated using a blank about the shape of the lens and machining the blank to produce the plug and the cap of the lens. The lens can be bonded to the LED package using a convex bead of adhesive deposited on the surface of the LED package and spreading the adhesive between the lens and the LED package.

25 Claims, 21 Drawing Sheets

(56) References Cited

U.S. PATENT DOCUMENTS

| | | |
|---|---|---|
| 5,959,316 A | 9/1999 | Lowery |
| 6,307,160 B1 | 10/2001 | Mei et al. |
| 6,351,069 B1 * | 2/2002 | Lowery et al. ............... 313/512 |
| 6,608,332 B2 | 8/2003 | Shimizu et al. |
| 6,610,563 B1 * | 8/2003 | Waitl et al. .................... 438/166 |
| 6,614,179 B1 | 9/2003 | Shimizu et al. |
| 6,642,652 B2 | 11/2003 | Collins, III et al. |
| 6,680,128 B2 | 1/2004 | Mei |
| 6,791,116 B2 | 9/2004 | Takahashi et al. |
| 6,828,170 B2 | 12/2004 | Roberts et al. |
| 7,064,353 B2 | 6/2006 | Bhat |
| 7,156,538 B2 | 1/2007 | Han et al. |
| 7,157,744 B2 | 1/2007 | Palmteer et al. |
| 7,168,608 B2 | 1/2007 | Mei |
| 7,199,446 B1 | 4/2007 | Mei et al. |
| 7,264,378 B2 | 9/2007 | Loh |
| 2001/0015778 A1 | 8/2001 | Murade et al. |
| 2002/0015013 A1 | 2/2002 | Ragle |
| 2002/0079837 A1 | 6/2002 | Okazaki |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1 | 6/2003 | Song et al. |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004435 A1 * | 1/2004 | Hsu ............... 313/512 |
| 2004/0004437 A1 | 1/2004 | Shimizu et al. |
| 2004/0036081 A1 | 2/2004 | Okazaki |
| 2004/0051111 A1 | 3/2004 | Ota et al. |
| 2004/0079957 A1 * | 4/2004 | Andrews et al. ............. 257/100 |
| 2004/0084687 A1 | 5/2004 | Hohn et al. |
| 2004/0102061 A1 | 5/2004 | Watanabe |
| 2004/0126918 A1 | 7/2004 | Kurahashi et al. |
| 2004/0129946 A1 * | 7/2004 | Nagai et al. .................... 257/98 |
| 2004/0173810 A1 | 9/2004 | Lin et al. |
| 2004/0188697 A1 | 9/2004 | Brunner et al. |
| 2004/0201025 A1 | 10/2004 | Barnett et al. |
| 2004/0207998 A1 | 10/2004 | Suehiro et al. |
| 2004/0257496 A1 | 12/2004 | Sonoda et al. |
| 2005/0035364 A1 | 2/2005 | Sano et al. |
| 2005/0093116 A1 | 5/2005 | Palmteer et al. |
| 2005/0093146 A1 | 5/2005 | Sakano |
| 2005/0145872 A1 | 7/2005 | Fang et al. |
| 2005/0179376 A1 | 8/2005 | Fung et al. |
| 2005/0199900 A1 | 9/2005 | Lin et al. |
| 2005/0221519 A1 * | 10/2005 | Leung et al. ................ 438/27 |
| 2005/0224829 A1 | 10/2005 | Negley et al. |
| 2005/0224830 A1 | 10/2005 | Blonder et al. |
| 2005/0253242 A1 | 11/2005 | Costello et al. |
| 2005/0270666 A1 * | 12/2005 | Loh et al. ..................... 359/726 |
| 2005/0286131 A1 | 12/2005 | Saxena et al. |
| 2006/0012299 A1 | 1/2006 | Suehiro et al. |
| 2006/0022212 A1 * | 2/2006 | Waitl et al. ..................... 257/98 |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0097385 A1 | 5/2006 | Negley |
| 2006/0102914 A1 | 5/2006 | Smits et al. |
| 2006/0105484 A1 | 5/2006 | Basin et al. |
| 2006/0105485 A1 | 5/2006 | Basin et al. |
| 2006/0157726 A1 * | 7/2006 | Loh et al. ..................... 257/100 |
| 2006/0170332 A1 | 8/2006 | Tamaki et al. |
| 2006/0284209 A1 * | 12/2006 | Kim et al. ..................... 257/100 |
| 2006/0289050 A1 | 12/2006 | Alley et al. |
| 2007/0090375 A1 | 4/2007 | Kobilke |
| 2007/0152212 A1 | 7/2007 | Cho et al. |
| 2007/0194341 A1 | 8/2007 | Chang et al. |
| 2007/0215893 A1 | 9/2007 | Liao et al. |
| 2007/0228390 A1 | 10/2007 | Hattori et al. |
| 2007/0278512 A1 * | 12/2007 | Loh et al. .................... 257/99 |
| 2008/0012036 A1 * | 1/2008 | Loh et al. .................... 257/99 |
| 2008/0048200 A1 | 2/2008 | Mueller et al. |
| 2008/0308825 A1 | 12/2008 | Chakraborty et al. |

FOREIGN PATENT DOCUMENTS

| | | |
|---|---|---|
| JP | 2000-349346 | 12/2000 |
| JP | 2000-349347 | 12/2000 |
| JP | 2001-057445 | 2/2001 |
| JP | 2001-168398 | 6/2001 |
| JP | 2002185046 | 6/2002 |
| JP | 2004-031508 | 1/2004 |
| JP | 2004-111937 | 4/2004 |
| JP | 2004241704 | 8/2004 |
| JP | 2004-253404 | 9/2004 |
| JP | 2004-259958 | 9/2004 |
| JP | 2004-266246 | 9/2004 |
| JP | 2004-274087 | 9/2004 |
| JP | 2004-282004 | 10/2004 |

OTHER PUBLICATIONS

Kading, O.W., Thermal conduction in metallized silicon-dioxide layers on silicon, Appl. Phys. Lett 65, 1994.

Yan, Xiantao, Two Test Specimens for Determining the Interfacial Fracture Toughness in Flip-Chip Assemblies, Transactions of the ASME, vol. 120, Jun. 1998, p. 150.

Yan, Xiantao, Analysis Based Design Guidelines for Metal Runner and Passivation Layers in IC Packaging, Delphi Automotive Systems Analytical Engineering Conference, May 2000, p. 1.

Official Action for Japanese patent application No. 2005-315149, Japan Patent Office, Examiner Tomohisa Tsuchiya, Jul. 21, 2009, pp. 1-3, 1-2.

Harper, Charles A. Electronic Materials and Processes Handbook. 2004, The McGraw-Hill Companies. Third Edition. p. 2.39.

* cited by examiner

LED PACKAGES WITH MUSHROOM SHAPED LENSES AND METHODS OF MANUFACTURING LED LIGHT-EMITTING DEVICES

CROSS-REFERENCE TO RELATED APPLICATIONS

The application is a continuation in part of U.S. patent application Ser. No. 11/260,101, filed on Oct. 26, 2005 now U.S. Pat. No. 7,670,872 entitled "Method of Manufacturing Ceramic LED Packages," which in turn claims the benefit of U.S. Provisional Patent Application No. 60/623,266 entitled "1-5 Watt and Higher LED Packages," U.S. Provisional Patent Application No. 60/623,171 entitled "3-10 Watt and Higher LED Packages," and U.S. Provisional Patent Application No. 60/623,260 entitled "5-15 Watt and Higher LED Packages," each filed on Oct. 29, 2004. The application is related to U.S. patent application Ser. No. 11/259,818 entitled "LED Package with Structure and Materials for High Heat Dissipation," and U.S. patent application Ser. No. 11/259,842 entitled "High Power LED Package with Universal Bonding Pads and Interconnect Arrangement," both filed on Oct. 26, 2005. The application is also related to U.S. patent application Ser. No. 11/036,559 filed on Jan. 13, 2005 and entitled "Light Emitting Device with a Thermal Insulating and Refractive Index Matching Material." All applications noted above are incorporated by reference herein.

BACKGROUND OF THE INVENTION

1. Field of the Invention

The present disclosure relates generally to light emitting diodes and more particularly to packages for high-power LEDs.

2. Description of the Prior Art

A light emitting diode (LED) is a semiconductor device that produces light when an electric current is passed therethrough. LEDs have many advantages over other lighting sources including compactness, very low weight, inexpensive and simple manufacturing, freedom from burn-out problems, high vibration resistance, and an ability to endure frequent repetitive operations. In addition to having widespread applications for electronic products as indicator lights and so forth, LEDs also have become an important alternative light source for various applications where incandescent and fluorescent lamps have traditionally predominated.

Using phosphors as light "converters," LEDs can also serve to produce white light. In a typical LED-based white light producing device, a monochromatic LED is encapsulated by a transparent material containing appropriate phosphors. In some systems, an LED that produces a monochromatic visible light is encapsulated by a material containing a compensatory phosphor. The wavelength(s) of the light emitted from the compensatory phosphor is compensatory to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is carefully controlled such that only a fraction of the blue light is absorbed by the phosphor while the remainder passes unabsorbed. The yellowish light and the unabsorbed blue light mix to produce white light. Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

Recent advances in semiconductor technology have made it possible to manufacture high-power LEDs that produce light at selected wavelengths across the visible spectrum (400-700 nm). Such high-power LEDs can have reliability and cost advantages over existing technologies such as incandescent lamps, arc lamps, and fluorescent lamps in many lighting applications. High-power LEDs also offer advantages for design of next generation color display technologies such as active matrix thin film transistor liquid crystal displays (TFTLCDs) in applications such as consumer computer and television monitors, projection TVs, and large advertising displays.

Although high-power LED devices have been manufactured, their widespread use has been limited because of a lack of suitable packages for the LEDs. Current LED packages cannot handle the high-power density of LED chips. In particular, prior art packages provide inadequate heat dissipation away from the LED dies. Inadequate heat dissipation limits the minimum size of the package and therefore the density of LEDs per unit area in the device. One measure of how efficiently a package dissipates heat is the temperature rise across the package for a given input electrical power. This measure is generally in the range of 15 to 20 degrees centigrade per watt (° C./W) from the junction to the case in current LED packages, usually too high to provide adequate heat dissipation for an LED package having a power higher than 1 watt.

Without sufficient heat dissipation, devices incorporating high-powered LEDs can run very hot. Light output, LED efficiency, and LED life, are each dependent on the LED die junction temperature. Inadequate heat dissipation will cause the LED Die to operate at a higher temperature and therefore limits the performance of the LED die when the LED die is capable of operating at a power level exceeding the limits of the package. Insufficient heat dissipation by an LED package can cause the LED device to fail at an early stage or render it too hot to use safely.

Even under less severe conditions, inadequate heat conduction for an LED package may result in poor thermal stability of the phosphors, as well as encapsulation and lens materials, in those devices that employ phosphors. Specifically, exposure to high temperatures for extended periods tends to alter the chemical and physical properties of such phosphors, encapsulation, and lens materials, causing performance deterioration. For instance, the light conversion efficiency can decline and the wavelength of output light can shift, both altering the balance of the light mixture and potentially diminishing the intensity of the overall output. For example, currently available phosphors are often based on oxide or sulfide host lattices including certain rare earth ions. Under prolonged high temperature conditions, these lattices decompose and change their optical behavior. Other problems commonly found with LED-based white light sources are transient color changes and uneven color distributions, both caused by temperature gradients in the phosphor-containing material and degradation of the encapsulation and lens materials. Such behaviors often create an unsatisfactory illumination. The above-mentioned thermal problems worsen with increasing temperature and therefore are particularly severe for devices that incorporate high-power LEDs with phosphors.

Attempts have been made in current LED packages to alleviate the above problem. One example is to directly attach an LED die to a top surface of a metal heat slug such as a copper plate. The copper plate serves to spread the heat and to make electrical connections with the LED die. This design limits the selection of materials for the heat slug because the design relies at least partially on the conductive nature of the copper for making the conductive contacts between the LED die and the top surface of the copper heat slug. The use of copper heat slugs also has other limitations, such as a substantial mismatch between the coefficients of thermal expansion (CTE) of the LED die material and the copper onto which the LED die is attached. A large CTE mismatch can create high stresses upon heating a cooling at bonded interfaces. Cracks that form at these interfaces then render the LED package unreliable. In addition, the above design is relatively expensive and difficult to manufacture.

Other problems associated with LED packages relate to how lenses are attached. Typically, a layer of transparent adhesive is used to secure the lens to the package. Frequently, air bubbles form in the adhesive. The air bubbles increase internal reflections of the light in the adhesive layer, reducing the amount of light transmitted through the adhesive layer. Additionally, the lens can also become inadvertently detached from the package. This can happen when the lens experiences a shear force, for example a side impact that "pops" the lens off the package.

Given the importance of LEDs as light sources, particularly high-power LEDs, there is a need for improved LED packaging methods and materials to alleviate the above-identified problems by providing better thermal performance (e.g., improved thermal resistance from junction to case) and higher reliabilities (e.g., lower stresses in packaging materials). Such packaging methods and materials will allow LEDs to produce higher optical performance (Lumens/package) from a smaller package or footprint higher optical performance any light source applications.

SUMMARY

The present disclosure addresses the above problems by providing methods for forming LED packages and light emitting devices. According to an embodiment of the invention, a method for forming an LED package comprises forming a panel, defining a grid on a surface of the panel, and separating the LED package from the panel by breaking the panel along lines of the grid. Forming the panel includes forming a top layer, an intermediate body layer, and a thermally conducting layer, and bonding the intermediate body layer between the top and thermally conducting layers. Forming the panel can further include forming an alignment layer, and these embodiments also include bonding the alignment layer to the top layer opposite the intermediate layer.

In some embodiments of the method of forming the LED package forming the thermally conducting layer includes preparing a sheet of AlN. Forming the thermally conducting layer can also include forming a sheet with a square array of vias disposed therethrough. Forming the thermally conducting layer can further include forming a metallization pattern on a top surface of the thermally conducting layer, and in these embodiments bonding the intermediate body layer includes bonding the intermediate body layer to the top surface of the thermally conducting layer. In some of these embodiments forming the thermally conducting layer further includes forming a metallization pattern on a bottom surface of the thermally conducting layer.

In some embodiments of the method of forming the LED package forming the intermediate body layer includes preparing a sheet of AlN. Forming the intermediate body layer can also include forming a sheet with a square array of vias disposed therethrough and an aperture disposed within each square defined by the array. Likewise, forming the top body layer can include preparing a sheet of AlN, and can also include forming a sheet with a square array of vias disposed therethrough and an aperture disposed within each square defined by the array. In some of these latter embodiments the aperture within each square has an inclined sidewall, and forming the top body layer can further include metallizing a sidewall of the aperture within each square. Forming the top body layer can further include forming a metallization pattern on a top surface of the top body layer, and in these embodiments bonding the intermediate body layer between the top and thermally conducting layers includes bonding the intermediate body layer to a bottom surface of the top body layer.

In other embodiments of the method of forming the LED package bonding the intermediate body layer between the top and thermally conducting layers includes co-firing. Bonding the intermediate body layer between the top and thermally conducting layers can also include aligning a square array of vias defined in each of the layers. The step of bonding the intermediate body layer between the top and thermally conducting layers can alternatively include applying an adhesive between two of the layers.

In still other embodiments of the method of forming the LED package forming the intermediate body layer includes forming a metal sheet with a square array of vias disposed therethrough an aperture disposed within each square defined by the array. In these embodiments bonding the intermediate body layer between the top and thermally conducting layers includes applying an electrically insulating adhesive between the intermediate body layer and the thermally conducting layer.

In yet other embodiments of the method of forming the LED package defining the grid on the surface of the panel includes scribing snap lines on the surface of the panel. Where one of the top, intermediate body, or thermally conducting layers is a non-ceramic layer, the step of forming the non-ceramic layer includes defining a grid thereon. In some of these embodiments defining the grid on the surface of the panel includes aligning the grid on the surface of the panel with the grid defined on the non-ceramic layer.

In still other embodiments of the method of forming the LED package forming the panel includes forming a square array of vias disposed therethrough. In some of these embodiments defining the grid on the surface of the panel includes scribing snap lines on the surface of the panel that intersect the vias. In these embodiments the method can further include plating metal into the vias.

According to another embodiment of the invention, a method for forming a light emitting device comprises forming a panel having a square array of vias disposed therethrough and a cavity disposed within each square defined by the array, defining a grid on a surface of the panel, bonding an LED die to a floor of each cavity, and separating the light emitting device from the panel by breaking the panel along lines of the grid. In some embodiments the method further comprises encapsulating each LED die. In some of these embodiments encapsulating each LED die includes forming a thermally insulating layer over each LED die, and forming a luminescent layer over each thermally insulating layer. Some embodiments of the method further comprise forming a lens over the LED die. In some of these embodiments forming the lens includes injection molding or printing with masks.

According to another embodiment of the invention, a light-emitting device comprises a package and a lens. The package includes a light-emitting side, an encapsulated LED configured to emit light toward the light-emitting side of the package, and a socket including a sidewall and a bottom surface, the socket disposed on the light-emitting side of the package. The lens includes a cap and a plug, where the plug is disposed within the socket. In some embodiments, the shape of the lens comprises a mushroom shape. An angle defined between the sidewall and the bottom surface of the socket can be between about 45 degrees to about 140 degrees. Likewise, an angle defined between a sidewall of the plug and a lower surface of the lens can also be between about 45 degrees to about 140 degrees. The light-emitting device can also include an adhesive layer, such as silicone, disposed between the lens and the package.

According to another embodiment of the invention, a method of fabricating a light-emitting device is provided. The exemplary method comprises providing a lens including a plug and a cap, and providing a package including an encapsulated LED configured to emit light toward a light-emitting side of the package, and a socket disposed on the light-emitting side of the package. The method further comprises depositing an adhesive within the socket, and attaching the lens to the light-emitting side of the package, such that the plug is disposed within the socket. In some embodiments, providing the lens comprises machining a lens blank, such as by turning the lens blank, to form the plug of the lens.

Another exemplary method of fabricating a light-emitting device also comprises providing a package including an encapsulated LED configured to emit light toward a light-emitting side of the package, and a socket disposed on the light-emitting side of the package. In this exemplary method, a mold defining a shape of a cap is placed over the socket, material is flowed into a space formed by the mold and the socket, and the material is cured to form the lens in place.

Still another exemplary method is directed to attaching an LED lens to an LED package to form a light-emitting device. This exemplary method comprises introducing a bead of adhesive, such as silicone, having a convex surface and a viscosity of about 2000 to 4000 centipoise onto a surface of the LED package, contacting a point on the convex surface of the bead of adhesive with a surface of the LED lens, and spreading the adhesive between the surface of the LED package and the surface of the LED lens. In some embodiments, the contacted point on the convex surface of the bead of adhesive is at about an apex of the convex surface of the bead of adhesive. In various embodiments a width of the bead of adhesive is between about 30 percent to about 55 percent of a length of the surface of the LED package, and a height of the bead of adhesive is between about 20 percent to about 35 percent of a width of the bead of adhesive.

DETAILED DESCRIPTION OF THE DISCLOSURE

Figure 1:
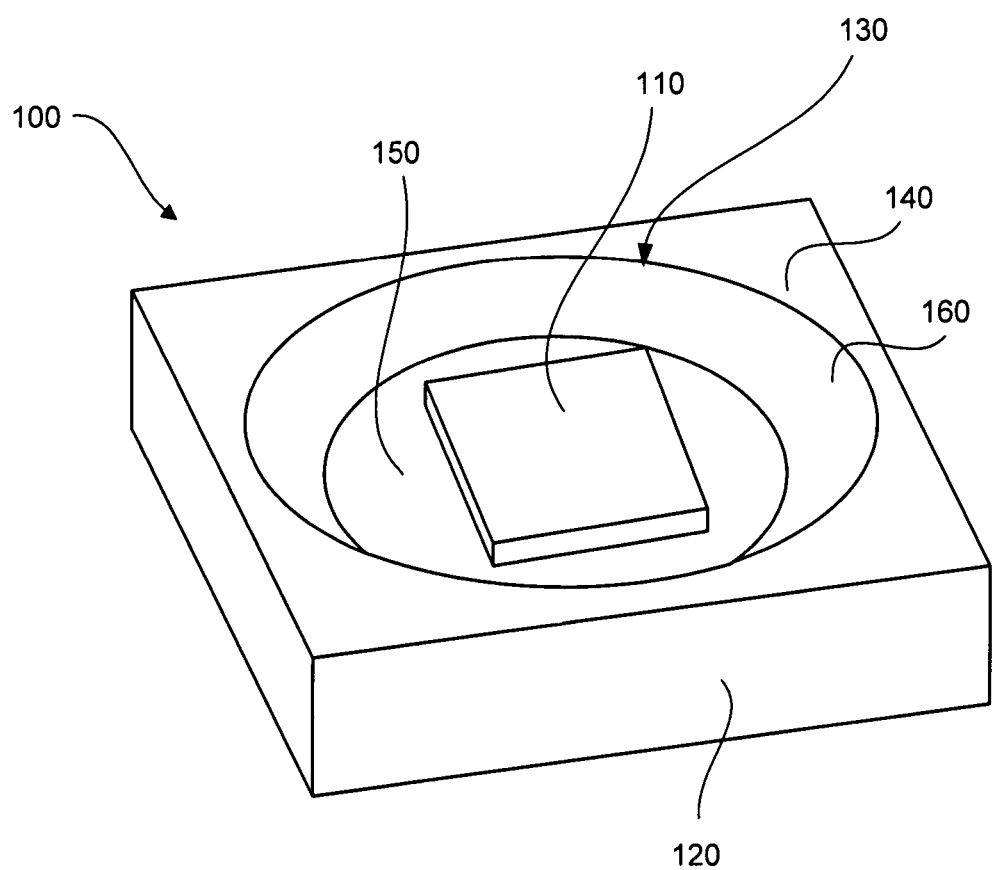
FIG. 1 is a perspective view of an LED die bonded to an exemplary LED package according to an embodiment of the present disclosure.

The present disclosure provides LED packages with structures and materials that provide higher heat dissipation than presently available. A further benefit of the present invention is improved matching of the coefficients of thermal expansion (CTES) of the LED dies and the materials to which they are bonded for higher reliability. Due to the improved heat conduction, the packages of the present invention allow high-power LEDs to operate at full capacity. Improved heat conduction also allows for both smaller packages and devices within which packages are placed more closely together.

One measure of how efficiently a package dissipates heat is the temperature rise across the package. Using this measure, in current high-power LED packages the thermal resistance from the junction to the case is generally in the range of 15 to 20° C./W. By comparison, an exemplary embodiment of the present disclosure has a lower thermal resistance of only about 6° C./W or 3° C./W for a four LED dice package. Therefore, the present disclosure enables LED devices for new applications in both high temperature environments (such as in an automobile engine compartment) and also in environments that cannot accommodate high temperature components (such as a dental curing light for use in a patient's mouth).

Accordingly, exemplary packages for high-power LEDs according to the present disclosure have the following features: 1) They offer higher performance by enabling 50% or greater luminosity per LED die as compared to prior art packages; 2) they provide a high thermal conductivity path to conduct heat away from LED dies; 3) they redirect light emitted at low solid angles (tangential light) into directions more nearly perpendicular to the surface of the LED die; and 4) they provide a material layer, for bonding to the LED die, having a CTE that is closely matched to the CTE of the LED die to minimize interfacial stresses and improve reliability.

The present disclosure provides embodiments for a package for a single high-power LED die in the 1 to 7 watt output power range that provides the desirable features discussed above. The present disclosure also provides embodiments to stabilize the wavelength (i.e., color) of LED dies. In the case of white LED applications, the present disclosure provides embodiments for improving white light LED efficiency.

The present disclosure also provides embodiments for a package for multiple high-power LED dies with a combined output in the 1 to 15 watt output power range. These packages have very small form factors and can be fabricated at low cost. The small form factors enable the design of light source optics with more compact sizes. Therefore, the present invention enables a new class of high-power LED-based light source and display applications to emerge.

The packages of the present invention can be used with LED devices that operate over the range of wavelengths from ultraviolet (UV) to Infrared (IR) which covers the range from 200 to 2000 nanometers. Further, packages of the present invention can include bonding pads configured to accommodate any of a number of different LED die designs that are presently available in the market. The present disclosure, in some embodiments, also provides a versatile package design whereby the thermal and electrical paths are separated. In this way, the package can be attached to a heat sink of a circuit board using either a thermally and electrically conductive epoxy or solder, or a thermally conductive and electrically non-conductive epoxy.

FIG. 1 is a perspective view of an exemplary LED package 100 according to an embodiment of the invention. To form a light emitting device, an LED die 110 is bonded to the LED package 100 as shown. The LED package 100 comprises a body 120 having a cavity 130 extending downward from a top surface 140 thereof. The cavity 130 includes a floor 150 for bonding to the LED die 110. In some embodiments, the LED package 100 has a square footprint enabling multiple light emitting devices to be densely arranged in a square array. The LED package 100 is intended primarily for LED dies that produce 1-5 watts of power, but is not limited thereto.

In the embodiment shown in FIG. 1, a sidewall 160 of the cavity 130 is inclined at an angle so that the cavity 130 takes the shape of an inverted and truncated cone. The sidewall can also be vertical, or nearly so. In some embodiments the sidewall 160 of the cavity 130 is inclined at a 45° angle. Preferably, the sidewall 160 is highly reflective at a wavelength emitted by the LED die 110. This can be achieved, for example, with a coating of a highly reflective material such as silver, though other materials can be used, depending on the wavelength of the light produced by the LED die 110. Thus, the sidewall 160 can serve to redirect light emitted from the edges of the LED die 110. The light from the edges of the LED die 110 is redirected in a direction perpendicular to a top surface of the LED die 110 so that the light emitted from the side surfaces of the LED die 110 adds to the light emitted from the top surface of the LED die 110. In other embodiments the sidewall 160 takes a parabolic shape to better focus the redirected light.

Figure 2:
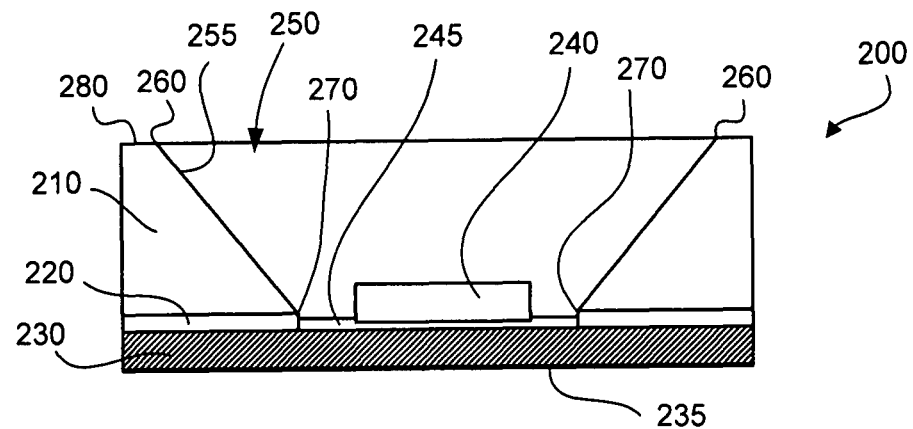
FIG. 2 is a cross-sectional view of an exemplary embodiment of the LED package of the present disclosure.

FIG. 2 is a cross-sectional view of one exemplary embodiment of an LED package 200 of the present disclosure. It can be seen from FIG. 2 that the LED package 200 comprises three layers (embodiments with four layers are described elsewhere herein) designated from top to bottom as a top body layer 210, an intermediate body layer 220 and a thermal conduction layer 230. The thermal conduction layer 230 has a bottom surface 235. An LED die 240 can be bonded to a top surface of thermal conduction layer 230 within a cavity 250 formed through layers 210 and 220. A thickness of intermediate body layer 220 is designed to be approximately the same as a thickness of a die attach layer 245 that bonds the LED die 240 to the thermal conduction layer 230. Also, in some embodiments a metallization layer on a sidewall 255 of the top body layer 210 extends from a top rim 260 at a top surface 280 of the top layer 210 to a bottom rim 270 near a bottom surface of the top body layer 210.

Figure 3:
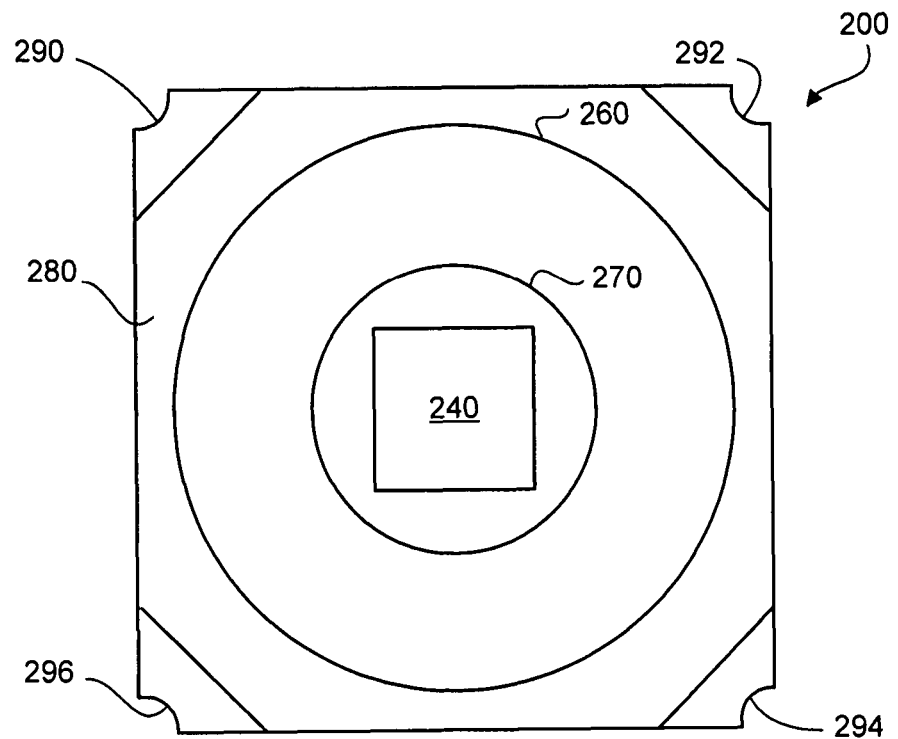
FIG. 3 is a top view of an exemplary LED package of the present disclosure.

FIG. 3 is a top view of the exemplary LED package 200 of FIG. 2. The top rim 260 and the bottom rim 270 correspond to the outer diameter and the inner diameter of the cavity 250 and are represented by two circles 260 and 270, respectively. It can be seen that the LED die 240 is positioned within the inner diameter 270. This embodiment also includes partial vias 290, 292, 294, and 296, one at each of the four corners of the LED package 200. The partial vias 290, 292, 294, and 296 are metallized, in some embodiments, to serve as electrical paths.

The thermal conduction layer 230 includes a thermally conductive material, which preferably has a thermal conductivity greater than about 14 W/m° K, and more preferably has a thermal conductivity greater than 150 W/m° K. Depending on applications, power density, desired package size and thickness of the several layers, a variety of thermally conductive materials can be used to form the thermal conduction layer 230. Such materials include, but are not limited to, aluminum nitride (AlN), alumina ($Al_2O_3$), Alloy 42, copper (Cu), copper-tungsten (Cu/W) alloy, aluminum silicon carbide, diamond, graphite, and beryllium oxide. In addition to thermal conductivity, the coefficient of thermal expansion (CTE), the fracture toughness, Young's modulus, and cost are other parameters to be considered in selecting the material for the thermal conduction layer 230.

Matching the CTE of the thermally conductive material with that of the LED die reduces interfacial stresses and therefore improves reliability. Preferably, the CTE of the thermally conductive material should be less than 15 parts per million per degree centigrade (ppm/° C.) in order to more closely match the CTE of typical LED die materials such as silicon. The mismatch in the CTEs between the LED package and the LED die according to embodiments of the present disclosure is about 4.7:3, whereas for prior art packages the best ratios are about 17:3. Improved heat dissipation allows packages of the present disclosure to have a smaller footprint and to be thinner than prior art packages. An exemplary embodiment of the present disclosure has dimensions of 4.4 mm×4.4 mm×0.9 mm vs. prior art packages that measure 14 mm×7 mm×2.5 mm.

The thermal conduction layer 230, with the help of layers 210 and 220 in some embodiments, dissipates much of the heat generated by the LED 240. For applications that demand the highest thermal dissipation capabilities, each of the three layers 210, 220, and 230 comprise ceramic AlN. AlN is desirable because it combines high thermal conductivity with a CTE that is very similar to that of LED substrate materials, such as SiC, sapphire, or silicon, the material from which solid-state LEDs are most frequently fabricated. However, $Al_2O_3$ can also be used for these layers for other applications. For some applications, thermal conduction layer 230 is made from either AlN or $Al_2O_3$ while layers 210 and 220 are made of other suitable materials including plastics and metals such as copper, aluminum, and Alloy 42. For some applications it is desirable to use the thermal conduction layer 230 as the primary thermal conduction path away from the LED die 240 in order to prevent heat from being directed towards the top of the package 200. For example, it may be desirable to keep the top of the light emitting device cool to the touch.

It will be appreciated that the package 200 does not need to be formed from three layers as illustrated by FIG. 2; more or fewer layers also can be used. For example, an embodiment with four layers is also described herein. Ceramic processing techniques can also be used to form the body as an integral unit. However, a layered configuration is desirable for the ease of fabrication. For some applications with secondary lenses, layers 210 and 220 are optional.

It will also be appreciated that heat produced by the LED die 240 is dissipated from the package 200 primarily through the thermal conduction layer 230. Consequently, layer 230 preferably has a thickness that is optimized for thermal conductivity therethrough. It has been found that for a given material, the thermal conductivity decreases if layer 230 is either too thin or too thick and, accordingly, there is an optimal thickness for optimal thermal conductivity. In the embodiment where AlN ceramic is used for a thermal conduction layer 230, the optimal thickness of layer 230 is in a range of 0.2 mm to 0.4 mm, and ideally about 0.3 mm.

It will be appreciated that the LED package 200 may be further attached to a heat sink (not shown) along the bottom surface 235. In addition, to optimize heat dissipation from the package 200 to the heat sink, the die attach layer 245 is preferably also thermally conductive. In the present disclosure, for a thin layer to be characterized as being thermally conductive, the material of the layer should have a thermal conductivity of at least 0.5 W/m° K, and ideally about 50 W/m° K.

In some embodiments, the thermal conductivity of the die attach layer 245 is desirably at least 1 W/m° K. The die attach layer 245 can comprise, for example, an electrically conductive epoxy, a solder, a thermally conductive and electrically non-conductive epoxy, or a nano-carbon-fiber filled adhesive. In some embodiments as discussed below, where the LED die 240 needs to make an electrical connection with the thermal conduction layer 230 through a central pad, the die attach layer 245 is also electrically conductive. In this disclosure, a thin layer material is considered to be electrically conductive if it has a volume resistivity less than $1\times10^{-2}$ ohm-meter. A material for an electrically conductive die attach layer 245 desirably has a volume resistivity less than $1\times10^{-4}$ ohm-meter.

The thermal conduction layer 230, in accordance with the present disclosure, may be either electrically conductive or electrically nonconductive. As described below, where the thermal conduction layer 230 is electrically nonconductive, the present disclosure uses a metallization pattern for the top surface of the thermal conduction layer 230 to provide necessary electrical contacts. This unique design makes it possible to fabricate the thermal conduction layer 230 from thermally conductive materials that are not electrically conductive, such as ceramics. Electrically nonconductive materials have conventionally been considered unsuitable for making heat slugs.

Figure 4A:
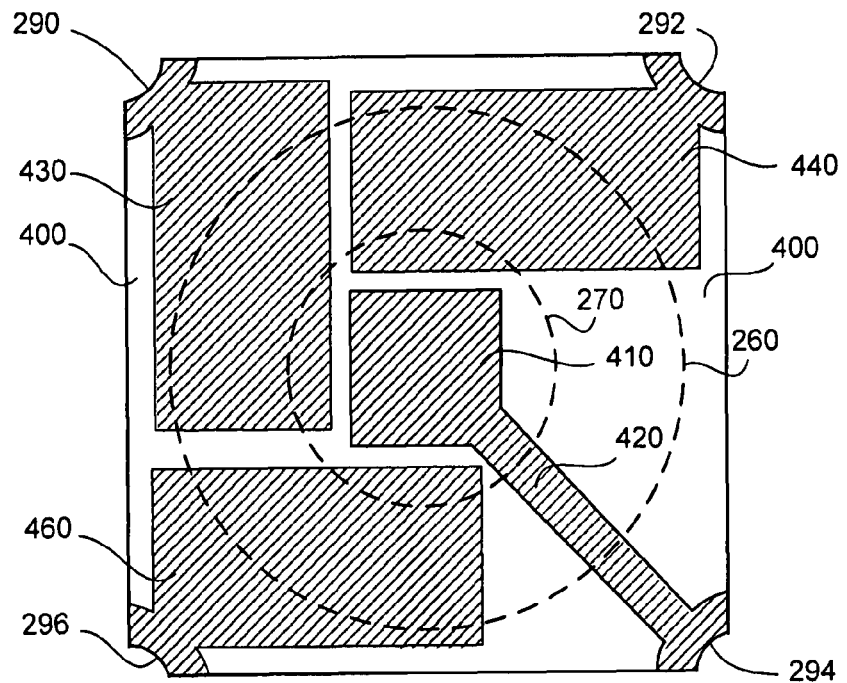
FIGS. 4A and 4B are exemplary metallization patterns for a top surface of a thermally conducting layer of an LED package according to embodiments of the present disclosure.

FIG. 4A illustrates an exemplary metallization pattern for the top surface of thermal conduction layer 230 of the LED package 200 of FIGS. 2 and 3. It can be seen that a generally square central pad 410 is connected by a trace 420 to one of the four partial vias (290, 292, 294, and 296), and partial via 294 particularly in FIG. 4A. Nickel and tungsten are exemplary metals for the metallization. The bottom surface of the LED die 240 is bonded, for example by solder, a thermally and electrically conductive adhesive, or a thermally conductive and electrically non-conductive adhesive, to the central pad 410. It will be appreciated that in those embodiments in which the central pad 410 for bonding the LED die 240 is not electrically conductive, the central pad 410 can be merely a region on the floor of the cavity rather than a patterned layer of some material on the floor of the cavity. In other words, the die attach layer 245 bonds the LED die 240 directly to the floor of the cavity in the central pad region.

The central pad 410 is surrounded on three sides by three bonding pads 430, 440, and 460, each connected to one of the remaining three partial vias 290, 292, and 296. An electrical contact (not shown) on the top surface of the LED die 240 is wire bonded to one of these three bonding pads 430, 440, and 460 where exposed on the floor of the cavity 250 (i.e., within the circle 270). The four partial vias 290, 292, 294, and 296 connect the bonding pads 430, 440, and 460 to external electrical contacts (not shown) on either the top of layer 210 or the bottom of layer 230, or both. These external electrical contacts provide leads to a power source on a circuit board. It can be seen from FIGS. 2-4 that after the package 200 is fully assembled most of the metallization pattern shown in FIG. 4A is sandwiched between layers 230 and 220 and hidden from view.

In the embodiment shown above in FIG. 4A, the central pad 410 serves both as an electrical connector and a thermal bonding pad between the LED die 240 and the top surface of the thermal conduction layer 230. To facilitate electrical connection, the LED die 240 may be either directly bonded to the central pad 410 or attached thereto using an electrically conductive adhesive. In this disclosure, an adhesive is considered to be electrically conductive if it has a volume resistivity less than $1\times10^{-2}$ ohm-meter. For better performance, an electrically conductive adhesive desirably should have a volume resistivity less than $1\times10^{-4}$ ohm-meter. It should be understood, however, that in some embodiments the central pad 410 serves as a thermal bonding pad but not as an electrical connector, as described elsewhere herein. In such embodiments, the central pad 410 is not connected to one of the partial vias 290, 292, 294, and 296. Instead, all partial vias 290, 292, 294, and 296 are connected to a respective side pad (such as the side pads 430, 440, and 460).

Figure 4B:
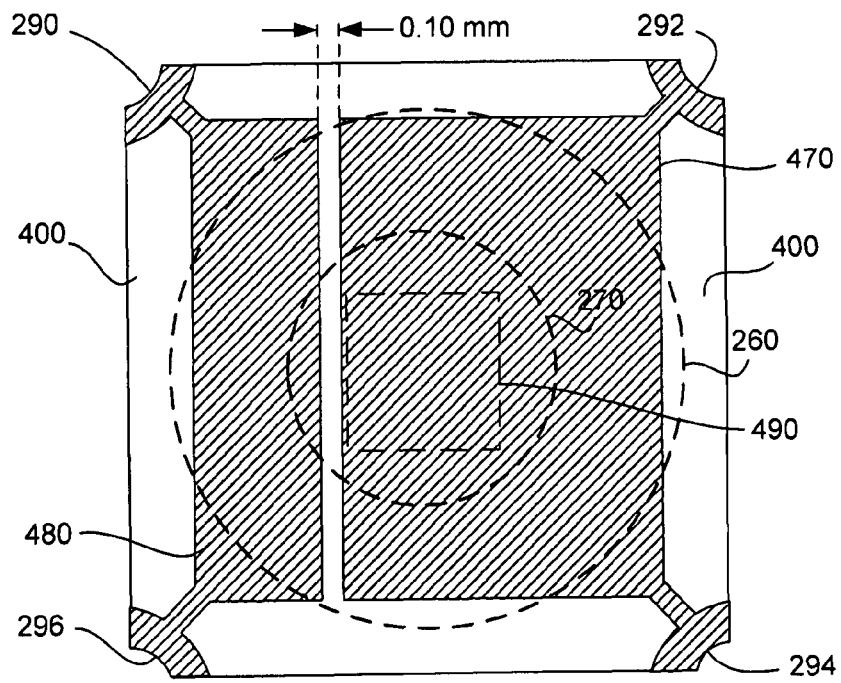

FIG. 4B illustrates another exemplary metallization pattern for the top surface of thermal conduction layer 230 of the LED package 200 of FIGS. 2 and 3. In this embodiment a first pad 470 is connected to two partial vias 292, 294, and a second pad 480 is connected to the other two partial vias 290, 296. An exemplary spacing between the first and second pads 470 and 480 is 0.10 mm. Nickel, tungsten, and silver are exemplary metals for the metallization. In some embodiments, silver is coated over another metal, such as nickel. Line 490 indicates where the bottom surface of the LED die 240 is bonded to the first pad 470. One benefit of the exemplary metallization pattern of FIG. 4B, compared to the metallization pattern shown in FIG. 4A, is that a greater area of the floor of the cavity within the inner diameter 270 is metallized, which serves to reflect a greater amount of light upward and out of the package.

Figure 5:
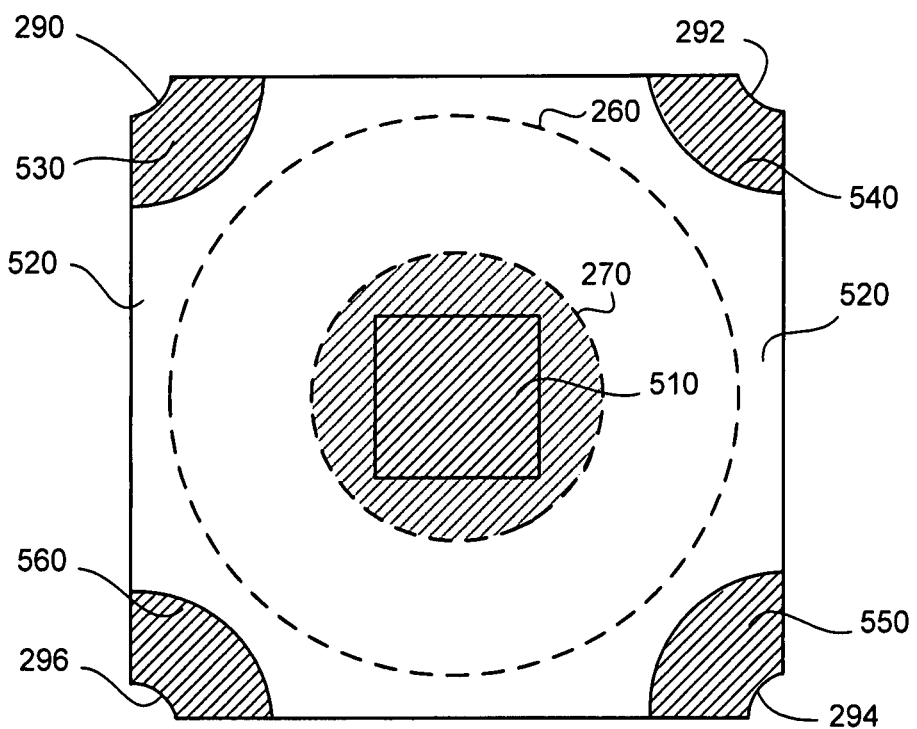
FIG. 5 is an exemplary metallization pattern for the bottom surface of a thermally conducting layer of an LED package according to an embodiment of the present disclosure.

FIG. 5 illustrates an exemplary metallization pattern for the bottom surface 235 of the thermal conduction layer 230. In this embodiment, a centrally located pad 510 provides a thermal path from the bottom 520 of layer 230 to a substrate (not shown) to which the package 200 is attached. The substrate can include a heat sink. The pad 510 is circular or square in some embodiments, but is not limited to any particular shape.

Each of the four partial vias 290, 292, 294, and 296 at the corners of the package 200 connect to one of the separate semi-circular electrical contacts 530, 540, 550, and 560, respectively. One of the four semi-circular electrical contacts, 550 in this particular embodiment, is connected through one of the four partial vias (294 in this case) and trace 420, as shown in FIG. 4A, to the central pad 410, while the other three semi-circular electrical contacts (530, 540, and 550 in this embodiment) connect to the three bonding pads 430, 440, and 460, respectively. Thus, when attached to the substrate, the centrally located pad 510 is soldered (or otherwise bonded, such as with a thermally conductive epoxy) to the substrate for heat dissipation and two of the four semi-circular electrical contacts 530, 540, 550, and 560 are connected to electrical contacts on the substrate to provide an electrical path through the LED package 200 and to the LED die 240. One of the two semi-circular electrical contacts (550 in this embodiment) connects through the central pad 410 to the bottom of the LED die 240, while the other (any one of 530, 540, and 560) is connected through its respective side bonding pad (430, 440, and 460) to the top of the LED die 240 by a wire bond (not shown). The particular semi-circular electrical contact 530, 540, or 560 that is used to connect to the LED die 240 is determined according to the characteristics and the requirements of the particular LED die 240.

It will be understood that by having an arrangement of several bonding pads in a number of different locations enables the same package to be used with different LED designs. Thus, an LED from one manufacturer may be bonded to one set of bonding pads while an LED from another manufacturer may be bonded to another set of bonding pads. In this respect the package is universal to different LEDs from different sources. Further still, the design of the package of the present invention allows for flexible and simple processes for attaching LEDs to the packages.

In alternative embodiments, the top surface 280 of the top body layer 210 has a metallization pattern to provide electrical contacts rather than the bottom surface of the thermal conduction layer 230. Each of the partial vias 290, 292, 294, and 296 at the corners and sides of the LED package 200 connect to a separate electrical contact on the top surface 140 of the top body layer 210. In these embodiments wire bonds to the electrical contacts on the top surface 140 of the top body layer 210 connect the LED package 200 to a power source or a circuit board. Locating the electrical contacts on the top of the package 200 rather than the bottom provides a greater area of contact between the bottom surface 235 and the substrate for even greater heat dissipation. The LED package 200 in these embodiments can be bonded to a substrate, for example, by solder or thermally conductive epoxy. The bond does not have to be electrically conductive.

It will be appreciated that the packages of the present disclosure provide improved heat dissipation in several ways, some of which are listed as follows. In some embodiments, the use of a material having superior thermal conductivity for the thermal conduction layer 230 improves heat dissipation. In other embodiments, the accommodation for an electrically nonconductive material for thermal conducting makes it possible to use unconventional thermally conductive materials, for example AlN ceramic, to form the thermally conducting layer. In other embodiments, optimizing the thickness of the thermal the conducting layer 230 further improves heat dissipation. In still other embodiments, providing a large area of contact between the bottom surface 235 of thermal conduction layer 230 and the substrate to which it attaches can further improve heat dissipation. In some embodiments, the packages of the present disclosure also direct a greater percentage of light out of the package, both reducing the heating of the package from absorbed light and increasing the light production efficiency.

Because of the improved heat dissipation, exemplary packages according to the present disclosure exhibit thermal resistances of about 6° C./W at an output greater than 1 watt per package. Exemplary packages according to the present disclosure with four LED dice exhibit a thermal resistance of 3° C./W, with outline dimensions of 7 mm×7 mm×1 mm. The present disclosure also makes highly compact LED packaging possible. In some exemplary packages, the square LED package has a width and length of about 4.4 mm and a thickness of about 1 mm (with thicknesses of about 0.5 mm, 0.1 mm and 0.3 mm for the top body layer, the intermediate body layer and the thermally conducting layer, respectively). The present disclosure therefore enables high-power LEDs to be used in higher-temperature environments, such as in automotive engine compartments, as well as in applications where high-temperature components cannot be tolerated, such as in dental applications, for example, in an illumination device used to cure dental cements.

The features disclosed in the present disclosure can be combined with other techniques of LED packaging. For example, the package of the present disclosure can further use encapsulating techniques as described in the U.S. patent application Ser. No. 11/036,559, entitled "Light Emitting Device with a Thermal Insulating and Refractive Index Matching Material," filed on Jan. 13, 2005, which is incorporated by reference herein.

Figure 6A:
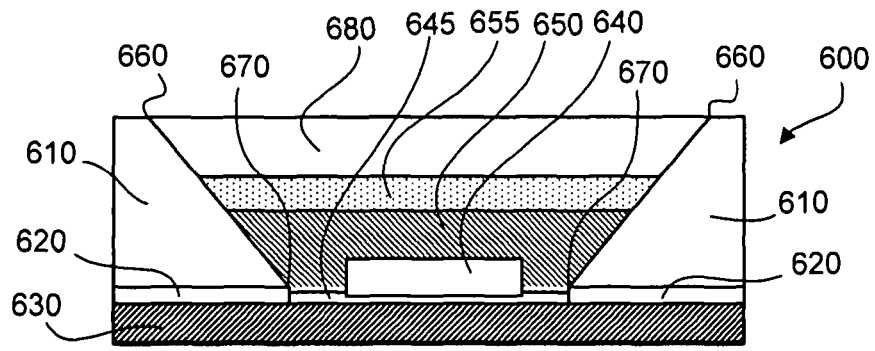
FIGS. 6A-6C are cross-sectional views of several exemplary embodiments of an LED package of the present disclosure.

FIG. 6A is a cross-sectional view of another exemplary embodiment of the LED package of the present disclosure. From top to bottom, the LED package 600 comprises layers 610, 620, and 630. Similar to the LED package 200 of FIG. 2, layer 610 is a top body layer, layer 620 is an intermediate body layer, and layer 630 is a thermal conducting layer. An LED die 640 mounted to a top surface of thermal conducting layer 630 through an LED die attach layer 645. A thermal insulation layer 650 and a luminescent layer 655 are placed in a tapered cavity having the shape of an inverted cone. The cavity has a side wall extending from a top rim 660 to a bottom rim 670. The LED package 600 also has an auxiliary member 680 enclosing the package from the top. The auxiliary member 680 is optional and can be, for example, an optical lens for focusing the light emitted from the LED package 600. The auxiliary member 680 can also serve as a protective capping layer.

It can be seen that the thermal insulation layer 650 is disposed between the luminescent layer 655 and a top surface of the LED die 640. The thermal insulation layer 650 at least partially protects the luminescent material in the luminescent layer 655 from the heat produced by the LED die 640, thus better maintaining thermal properties, such as light conversion efficiency and output wavelength, at or near optimal values far longer than under the prior art. The thermal insulating material of thermal insulation layer 650 can also be a material with an index of refraction chosen to closely match that of the material of the LED die 640.

The use of a thermal insulating material to protect the luminescent material within the encapsulant member from the heat produced by the LED is made particularly effective when applied in the LED packages of the present disclosure. It will be appreciated that prior art light emitting devices do not include thermal insulation to protect phosphors from the heat generated by the LEDs because heat dissipation has been an overriding concern in such devices. Put another way, designers of prior art light emitting devices have sought to dissipate as much heat as possible through the phosphor-containing layers (e.g., luminescent layer 655) because to do otherwise would require too much heat dissipation through the remainder of the light emitting device. However, where the thermally conducting layer 630 provides sufficient heat conduction, it is no longer necessary to conduct heat through the phosphor-containing luminescent layer 655, and thermal insulation can be introduced to shield the luminescent materials.

The thermal insulation layer 650 is preferably transparent, or nearly so, to the light emitted from the LED die 640. The thermal insulating material is therefore preferably transparent to at least one wavelength emitted by the LED die 640. The wavelengths emitted by various available LEDs extend over a wide spectrum, including both visible and invisible light, depending on the type of the LED. The wavelengths of common LEDs is generally in a range of about 200 nm-2000 nm, namely from the infrared to the ultraviolet.

In order to effectively thermally insulate the luminescent layer 655, the thermal insulating material of the thermal insulation layer 650 should have a low thermal conductivity, desirably with a thermal conductivity of no more than 0.5 watt per meter per degree Kelvin (W/m° K), and more desirably with a thermal conductivity of no more than 0.15 W/m° K. The thermal insulating material for the thermal insulation layer 650 desirably also has high heat resistance, preferably with a glass transition temperature, $T_g$, above 170° C., and more preferably a glass transition temperature above 250° C. Furthermore, in order to have good thermal compatibility and mechanical compatibility between the thermal insulation layer 650 and other components, especially the LED die 640, which are typically semiconductor materials, the thermal insulating material desirably has a coefficient of thermal expansion no greater than 100 ppm/° C., and more desirably a coefficient of thermal expansion no greater than 30 ppm/° C.

Luminescent materials suitable for the present invention include both fluorescent materials (phosphors) and phosphorescent materials. Phosphors are particularly useful for LED-based white light sources. Common phosphors for these purposes include Yttrium Aluminum Garnet (YAG) materials, Terbium Aluminum Garnet (TAG) materials, ZnSeS+ materials, and Silicon Aluminum Oxynitride (SiAlON) materials (such as α-SiAlON).

The present invention also provides a light emitting device comprising a package of the invention configured with an LED die and a luminescent material. In one embodiment, light emitting device produces white light based on a monochromatic LED. This can be done, for example, by using a visible light LED and a compensatory phosphor, or by using an invisible light LED together with RGB phosphors. For instance, a blue LED-based white light source produces white light by using a blue light LED and a phosphor that produces a yellowish light.

Figure 6B:
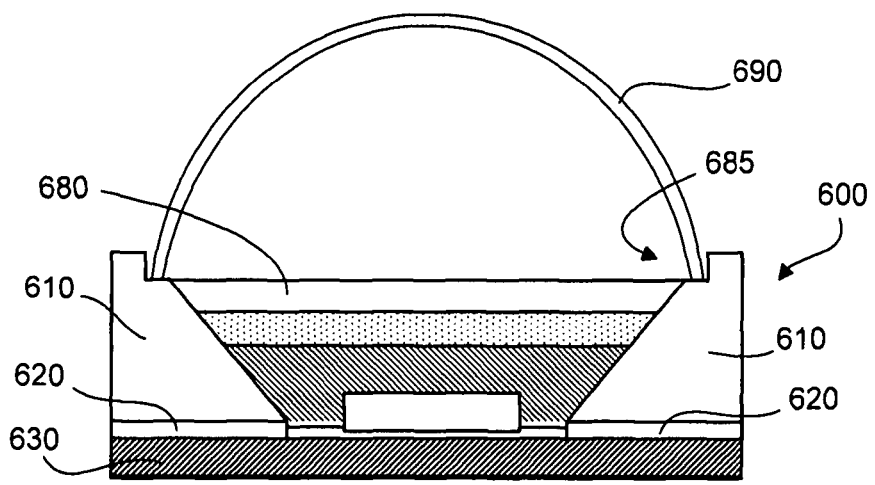
Figure 6C:
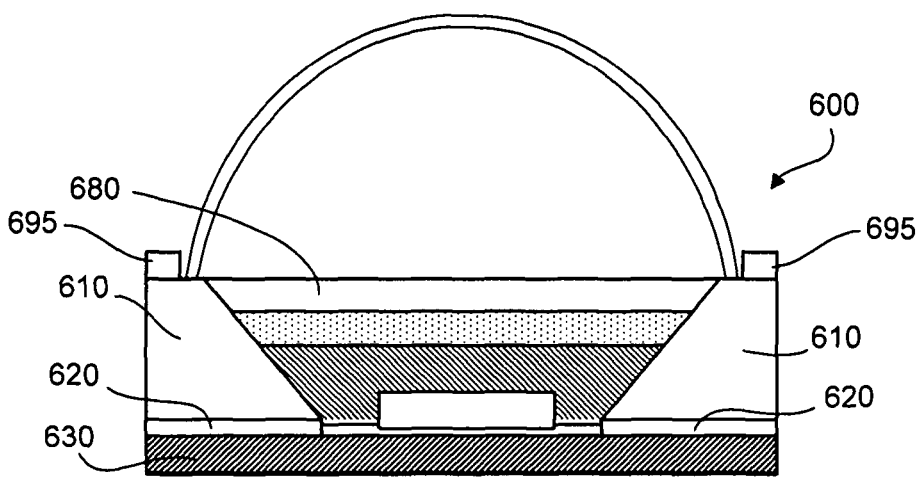

FIGS. 6B and 6C show cross-sections of additional embodiments of the LED package 600. In FIG. 6B the top body layer 610 includes a circular notch 685 to receive a lens 690. The lens 690 can be glass or plastic, for example. The notch 685 beneficially provides a guide that centers the lens 690 over the LED die 640 during assembly. In some of these embodiments, the top body layer 610 comprises a metal such as a copper-tungsten (Cu/W) alloy. The tapered cavity and the notch 685, in some of these embodiments, are formed by a stamping operation. In further embodiments, the intermediate body layer 620 and the thermal conducting layer 630 are also made of alumina.

In FIG. 6C the LED package 600 comprises an alignment layer 695 placed above the top body layer 610. A circular aperture in the alignment layer 695 creates essentially the same guide for the lens 690 as described above with respect to FIG. 6B. The alignment layer 695 can include, for example, metal or ceramic. In those embodiments in which layers 610, 620, and 630 include AlN, the alignment layer 695 can also include AlN.

Figure 7:
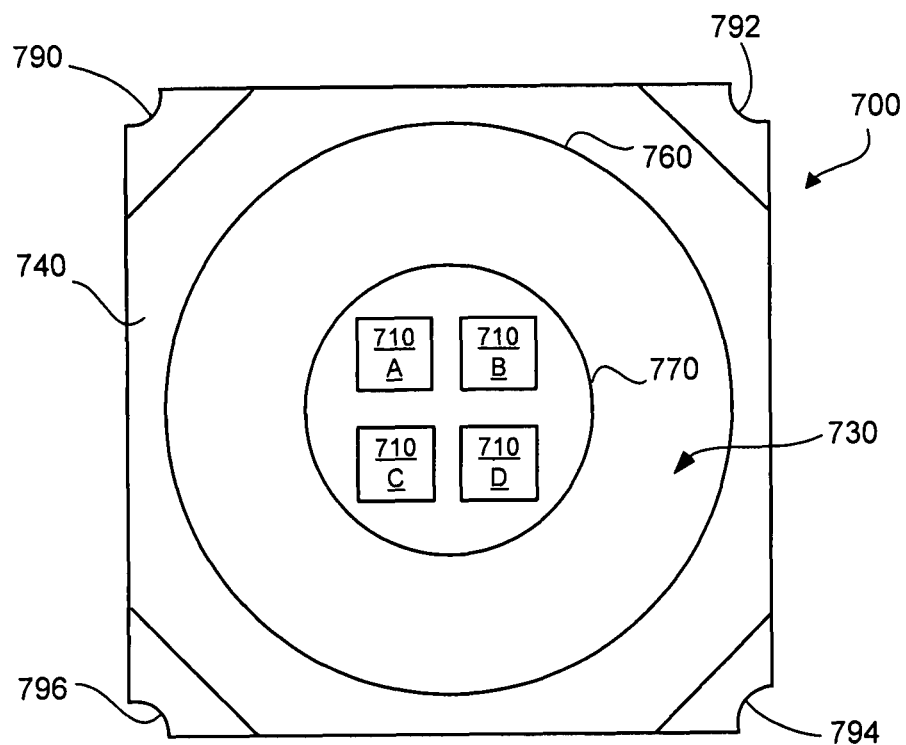
FIG. 7 is a top view of an LED package in accordance with another embodiment of the present disclosure.

The LED package of the present invention, in some embodiments, can support multiple LED dies within a single package to further increase the output level and density. FIG. 7 is a top view of an LED package 700 in accordance with another embodiment of the present disclosure. The LED package 700 is similar to the LED package 200 in FIGS. 2-5, except that the LED package 700 contains multiple LEDs (710A, 710B, 710C, and 710D) instead of a single LED. The top view of the LED package 700 shows the cavity 730, the top surface 740, the outer diameter 760 and the inner diameter 770 of the cavity 730, and the four partial vias 790, 792, 794, and 796. In the particular embodiment shown in FIG. 7, the LED package 700 includes four LEDs 710A, 710B, 710C, and 710D, although in principle any other number of LEDs may be arranged in a package of the present invention. The four LEDs 710A, 710B, 710C, and 710D can be the same or different, and in some embodiments are independently operable. For example, the multiple LEDs (710A, 710B, 710C and 710D) may be selectively operable and may be operable in any combination. The LED package 700 is intended to provide an LED package capable of producing an output of 1-15 watts with a thermal resistance of 3° C./W, but is not limited thereto.

Methods are disclosed for fabricating a layered LED package as described with reference to FIGS. 2-7. The methods vary depending upon the materials selected for each layer, specific designs, such as the pattern of metallization and the location and routing of the electrical connections, and applications of the LED package. In those embodiments shown in FIGS. 2-5 and in which all three layers 210, 220, and 230 are made of a ceramic, for example, the layers 210, 220, and 230 can be manufactured separately, stacked together, and co-fired (sintered) to bond the layers 210, 220, and 230 together. When non-ceramic materials are used for layers 210 and 220, however, the layers 210 and 220 can be bonded together with suitable adhesives or solders.

Figure 8:
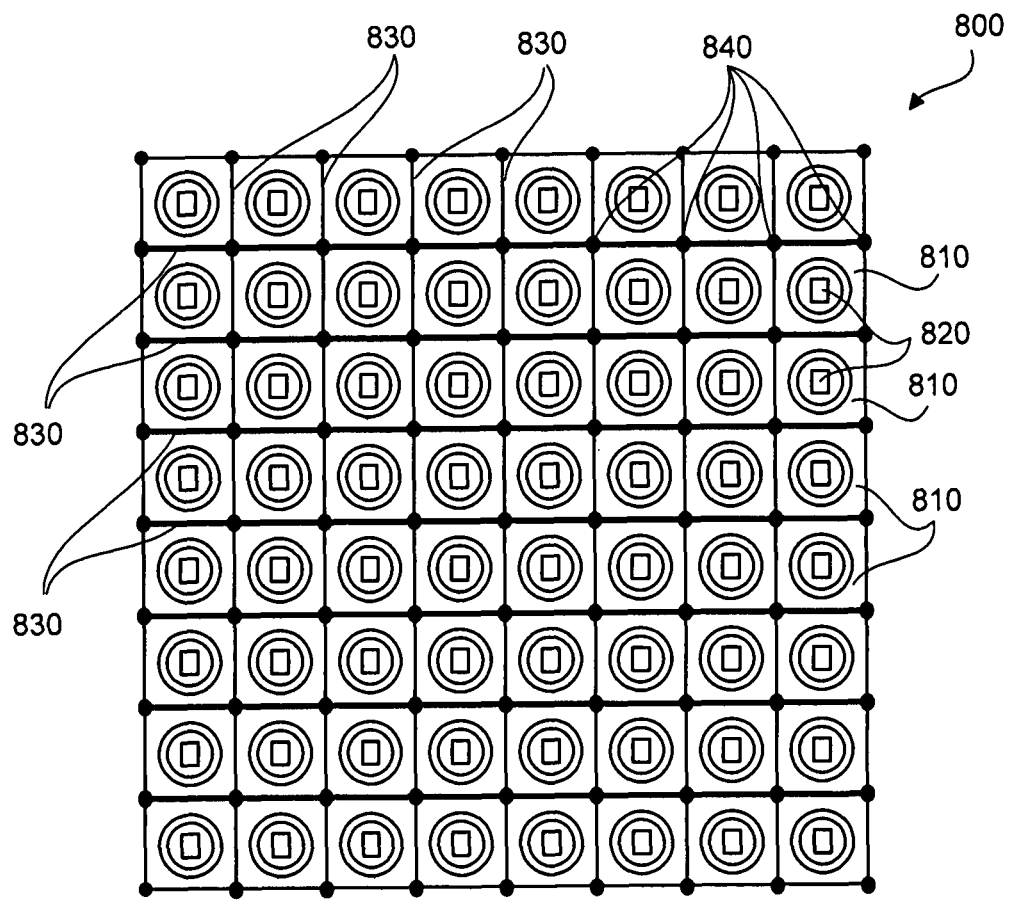
FIG. 8 is a top view of a plurality of LED packages manufactured in parallel during an exemplary embodiment of a fabrication process.

In one embodiment of the method of the invention, multiple LED packages are formed together in a batch process in which the individual LED packages are fabricated in parallel as a panel 800 from which individual LED packages can later be separated. FIG. 8 shows a top view of a plurality of LED packages 810 manufactured in parallel during an exemplary embodiment of a fabrication process. In this embodiment, the LED packages 810, which can be fabricated to include LED dies 820, are assembled in a square grid pattern separated by snap lines 830. Rows or columns of the packages 810 can be snapped apart along the snap lines 830, and then further sub-divided into individual LED packages 810. According to this embodiment, each of the top body layer (e.g., 210), the intermediate body layer (e.g., 220) and the thermally conducting layer (e.g. 230) for the plurality of LED packages 810 is produced as a whole piece, and each layer is independently fabricated as a sheet and then bonded together. LED dies 820 can be added to the grid of LED packages 810 before the grid is separated into individual LED packages 810.

Easily fractured materials, such as ceramics, are particularly suited for the above described embodiment. Separating the grid into the individual LED packages 810 would be difficult if a metal, such as copper, is used to form a bottom plate for heat dissipation. If a material that is not easily fractured is used for any of the three layers (e.g., the top body layer 210, the intermediate body layer 220 and the thermal conduction layer 230), it may be necessary to prepare such layers along the snap lines 830 with deep grooves or perforations to facilitate separation.

The grid in FIG. 8 also includes an array of vias (holes) 840 along the snap lines 830. Each via 840 is shared by four neighboring LED packages 810, except for those located at an edge or corner which would be shared by either one or two neighboring LED packages 810. After the individual LED packages 810 are separated along the snap lines 830, the vias 840 are separated apart to become partial vias (e.g., 290, 292, 294 and 296).

To produce a thermally conducting layer (e.g., 230 or 630) using a ceramic material according to a particular embodiment, for example, a ceramic layer of a material such as AlN is prepared with a square array of vias 840 disposed therethrough. The vias 840 sit at the intersections of the snap lines 830 in FIG. 8. Ultimately, when the LED packages 810 are separated from one another, each via 840 becomes a partial via (e.g., 290, 292, 294, and 296) of four different neighboring packages 810. The top and bottom surfaces of the ceramic layer are patterned, in exemplary embodiments, with metallization as shown in FIGS. 4 and 5. Patterning can be achieved, for example, by plating. Suitable metals for the metallization include tungsten and nickel. These patterns are repeated for each package 810 that will be produced.

Various patterns of metallization may be used to achieve different effects and to suit the different requirements of the LED dies 820. In some embodiments, for example, the central pad (e.g., the central pad 410 in FIG. 5) serves both as a thermal contact and an electrical contact. In these embodiments, the central pad on the top surface of the thermally conducting layer (230) is connected by a trace (420) to one of the partial vias (294) so that an electrical connection extends from the central pad to the opposite surface of the thermally conducting layer. If desirable, the electrical connection may be further extended to the central pad (510). In these embodiments, a small patch of AlN, or another material, can be placed over the trace (420) between the central pad and the partial via to prevent solder from flowing along the trace during soldering.

To produce an intermediate body layer (e.g., layer 220), according to this embodiment, a layer of a material such as AlN is prepared with a square array of vias disposed therethrough. The square array of vias matches the square array of vias in the thermally conducting layer. Additionally, a square array of apertures is defined in the layer such that each aperture is centered in a square defined by four adjacent vias. These apertures correspond to the inner diameter of the cavity (e.g., the inner diameter 270 in FIGS. 2-5) of the respective LED package.

To produce a top body layer (e.g., layer 210), according to this embodiment, a layer of a material such as AlN is prepared with a square array of vias disposed therethrough. The square array of vias matches the square arrays in the thermally conducting layer and the intermediate body layer. Additionally, a square array of apertures is defined in the layer such that each aperture is centered in a square defined by four adjacent vias. The array of apertures on the top body layer match the array of apertures on the intermediate body layer but have a different diameter. These apertures are preferably inclined or otherwise shaped to provide a sidewall as discussed above with respect to FIGS. 1-3. Specifically, in a preferred embodiment, each inclined aperture has a top rim that corresponds to the outer diameter (e.g., the outer diameter 260 in FIGS. 2-5) of the cavity in the respective LED package, and a bottom rim that corresponds to the inner diameter (e.g., the inner diameter 270 in FIGS. 2-5) of the cavity in the respective LED package 810. The top body layer is then metallized to provide sidewall metallization and any electrical contacts for the top surface. For the embodiments that do not require electrical contacts for the top surface of the top body layer, no electrical contacts are formed on the top surface.

Once the thermally conducting layer, the intermediate layer and the top body layer are individually prepared, the three layers are brought together in an assembly, the vias in each layer are aligned, and the three layers are bonded together. As noted above, where all three layers are ceramic the assembly can be co-fired, else the layers can be bonded together with a suitable adhesive or solder. In the latter embodiments, the adhesive can serve to electrically insulate the metallization on the top surface of the thermally conducting layer (e.g., metallization pattern shown in FIG. 4A) from an intermediate layer comprising a metal such as copper. Once the layers have been bonded to one another, the vias 840 can be plated to provide electrical connections between metallizations on the various surfaces of the layers.

Although the LED packages 810 can be separated at this point for subsequent fabrication into light emitting devices, it is often desirable to first attach LED dies 820 to form an entire panel 800 of light emitting devices in parallel. To create a panel 800 of light emitting devices, solder flux or a thermally conductive die-attach is dispensed and the LED dies 820 are bonded to the LED packages 810. Then, each LED die 820 is wire bonded to the appropriate bonding pads. Preferably, the cavities of the LED packages 810 are next filled to encapsulate the LED dies 820. In some embodiments this process includes forming a thermally insulating layer over the LED die 820, forming a luminescent layer over the thermally insulating layer, and then forming a lens over the luminescent layer. Finally, the assembly is diced along the snap lines 830. It will be appreciated that the light emitting devices of the present invention can be manufactured with fewer processing steps than prior art devices, in some instances fewer than half as many steps.

To produce an embodiment such as that shown in FIG. 6C, in which a ceramic alignment layer 695 is included, the method described above can be modified so that the alignment layer 695 is co-fired together with the thermally conducting, intermediate, and top body layers. Alternately, a metal alignment layer 695 can be bonded to the top body layer with a suitable adhesive or solder.

In those embodiments that include an alignment mechanism for aligning a lens such as lens 690 in FIGS. 6B and 6C, the lens can be added to the package 810 in a number of different ways. In some embodiments, a vacuum tool is used to pick up a lens and move the lens into position. In other embodiments a number of lenses are held on a strip of tape; a lens on the tape is aligned with the package 810 and a tool presses the lens into the guide to transfer the lens from the tape and to the package 810. It will be appreciated that lens transfer by vacuum tool or from tape can be achieved either before or after the LED packages 810 are separated from one another.

In an exemplary batch process that can be performed before the LED packages 810 are separated from the panel 800, the lenses are formed by injection molding. In this process a mold having an array of lens-shaped wells is sealed to the panel 800 so that one well is aligned with each of the packages 810. A suitable plastic is injected into the mold to fill the wells. The plastic is then cured to form the lenses. In another exemplary batch process, the lenses are formed by mask printing.

Figure 9:
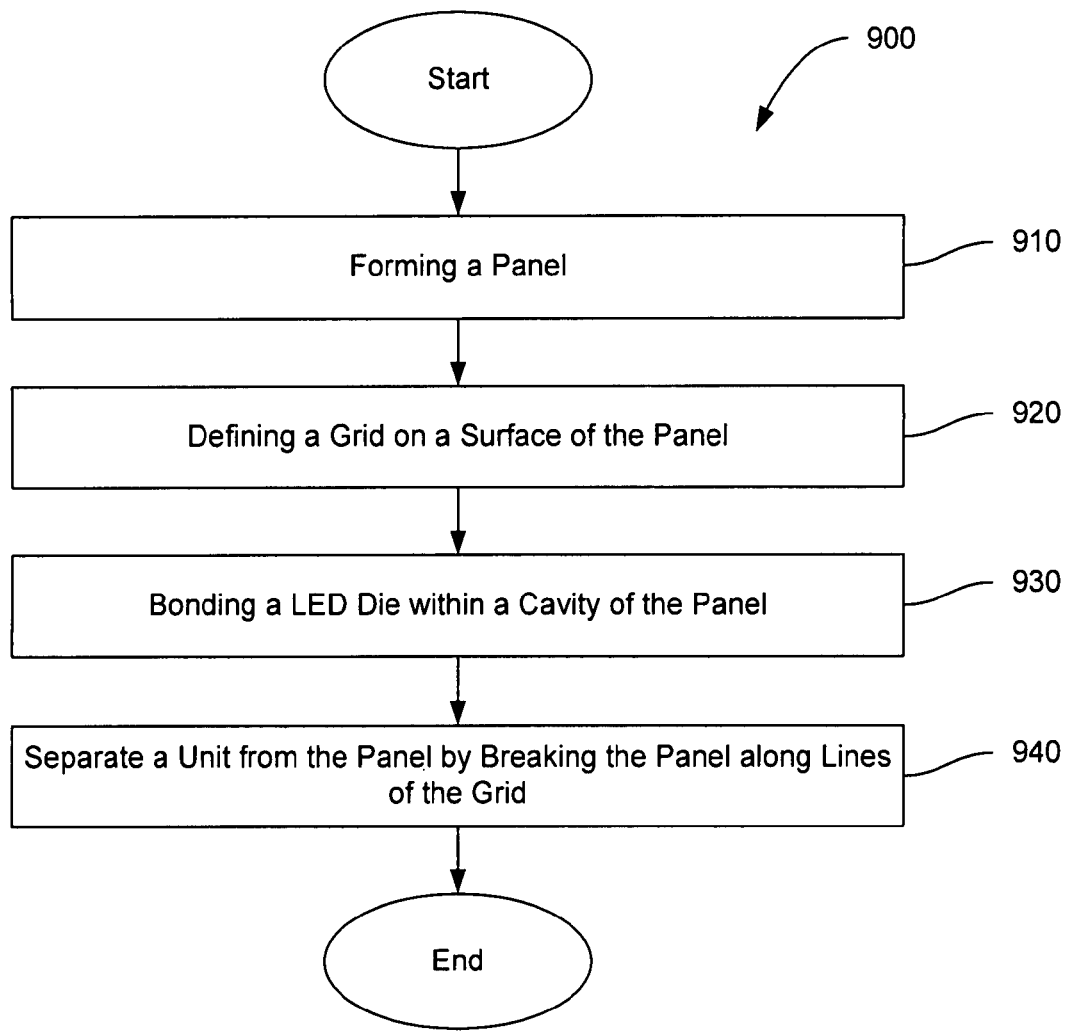
FIG. 9 is a flowchart for a method according to an exemplary embodiment of the invention.

FIG. 9 depicts a method 900 according to an exemplary embodiment of the invention. Method 900 comprises a step 910 of forming a panel, a step 920 of defining a grid on a surface of the panel, an optional step 930 of bonding an LED die within a cavity of the panel, and a step 940 of separating a unit from the panel by breaking the panel along lines of the grid. In those embodiments in which method 900 is directed to forming an LED package, step 930 is omitted and the resulting unit, the LED package, does not have an LED die. The LED die can be subsequently added to the package to form a light emitting device. In those embodiments in which method 900 is directed to forming a light emitting device, the LED die is added to a cavity within the panel in step 930 before the unit, in this case the light emitting device, is separated from the panel in step 940.

The present disclosure further provides LED package structures and lens structures that provide stronger attachments between the lenses and the LED packages. The improved attachment provides increased resistance to separation of the lenses from the LED packages caused by mismatched CTEs, or thermal effects such as adhesive degradation. The improved attachment further provides resistance to separation due to mechanical stresses to the devices, or due to shear forces between the lenses and the LED packages. The present disclosure further provides methods for lens fabrication. The present disclosure also provides a method for applying an adhesive layer between a lens and an LED package that reduces internal reflection of light within the adhesive layer, which increases total luminosity and overall efficiency of the LED device.

Figure 10:
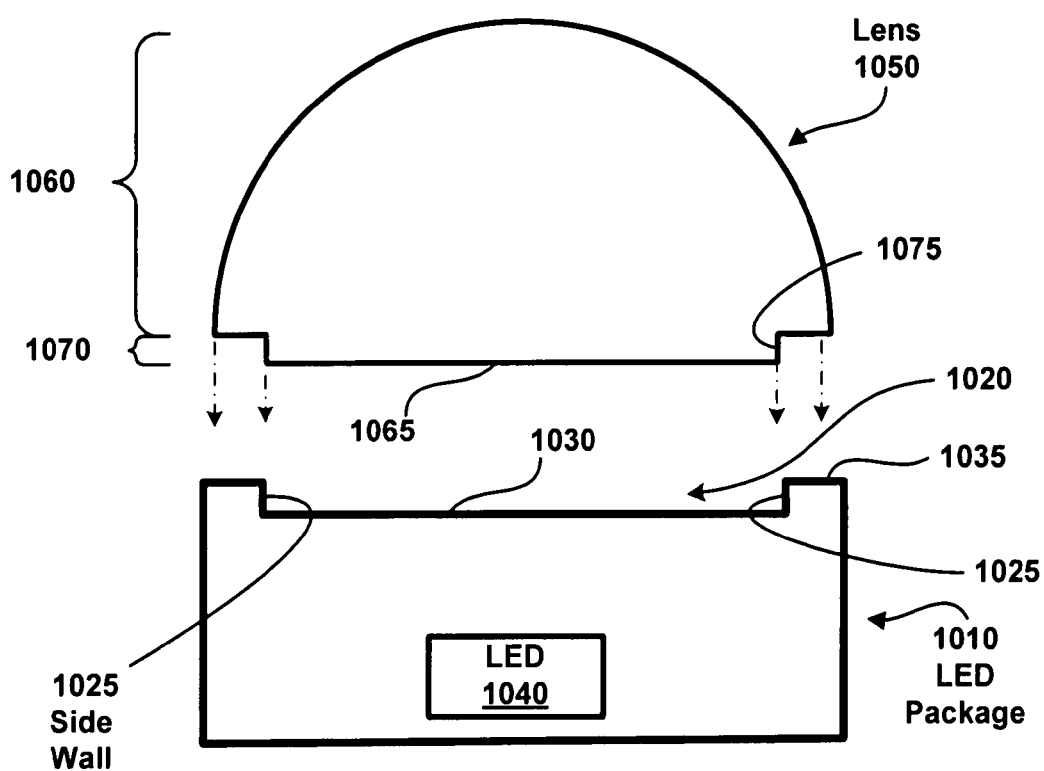
FIGS. 10 and 11 show cross-sectional views of an LED package and a lens in accordance with an embodiment of the present disclosure.
Figure 11:
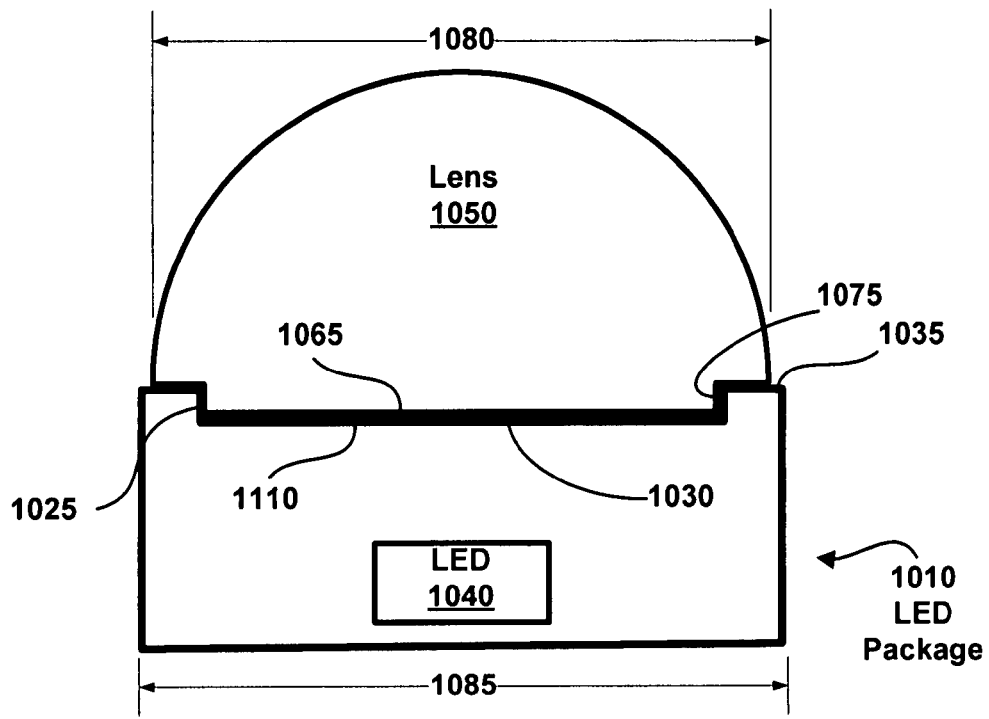

FIGS. 10 and 11 show cross-sectional views of an LED package 1010 and a lens 1050 of the present disclosure. FIG. 10 shows the lens 1050 and the LED package 1010 prior to assembly and FIG. 11 shows the lens 1050 mounted on the LED package 1010. The LED package 1010 includes an encapsulated LED 1040, a socket 1020, and a top surface 1035. The encapsulated LED 1040 is configured to emit light toward a light-emitting side of the LED package 1010. The socket 1020 is disposed on the light-emitting side of the LED package 1010 and is defined by a sidewall 1025 and a socket floor 1030. The sidewall 1025 can be a continuous surface around the periphery of the socket floor 1030 of the socket 1020. The top surface 1035 is exterior to the socket 1020 and may form a generally annular surface about the periphery of the socket 1020.

In some embodiments, the LED package 1010 includes various layers (e.g., a thermal conducting layer, a thermal insulation layer, a luminescent layer, protective capping layer, an intermediate body layer, a top body layer, etc.) as described elsewhere herein. As discussed with respect to FIG. 6C, an alignment layer with an aperture, such as the alignment layer 695, can be used to form the socket 1020.

The lens 1050 includes a cap 1060, a plug 1070, and a lower surface 1065. In plan view, the lens 1050 can be circular, oval, rectangular, or various other shapes. In various embodiments, the cap 1060 is convex, concave, or various other shapes configured to focus, disperse, mask, or otherwise modify light emitted from the LED package 1010. Examples of other shapes for the cap 1060 include an asymmetric shape, a Fresnel surface, a collimating lens, etc. In some embodiments, the lens 1050 has a mushroom shape. In some embodiments, the surface of the cap 1060 is configured to diffuse light exiting the lens 1050, for example using a textured surface.

The plug 1070 is configured to fit into the socket 1020 and includes a sidewall 1075. The sidewall 1075 forms a continuous surface around the periphery of the plug 1070. The plug 1070 mechanically stabilizes the attachment of the lens 1050 to the LED package 1010 and serves to resist shear forces between the lens 1050 and the LED package 1010 that can result in the lens 1050 becoming loose and/or separating from the LED package 1010. The lens 1050 can be secured to the LED package 1010 using a press fit, a friction fit, or an interference fit between the sidewall 1075 of the plug 1070 and the sidewall 1025 of the socket 1020.

The plug 1070 further provides additional bonding surfaces such as the lower surface 1065 and the sidewall 1075 for securing the lens 1050 to the LED package 1010. For example, the lens 1050 can be secured to the LED package 1010 using an adhesive 1110 between the lens 1050 and the LED package 1010. In some embodiments, the adhesive 1110 is applied to the top surface 1035 and bonds the cap 1060 to the LED package 1010. Alternatively, the adhesive 1110 can form a layer between the lens 1050 and the LED package 1010. In some embodiments, the adhesive 1110 forms a layer that extrudes between the top surface 1035 of the LED package 1010 and the cap 1060. While the cap 1060 is illustrated in FIG. 11 as having a width 1080 that is less than a width 1085 of the LED package 1010, the width 1080 of the cap 1060 can be greater than the width 1085 of the LED package 1010.

Figure 12:
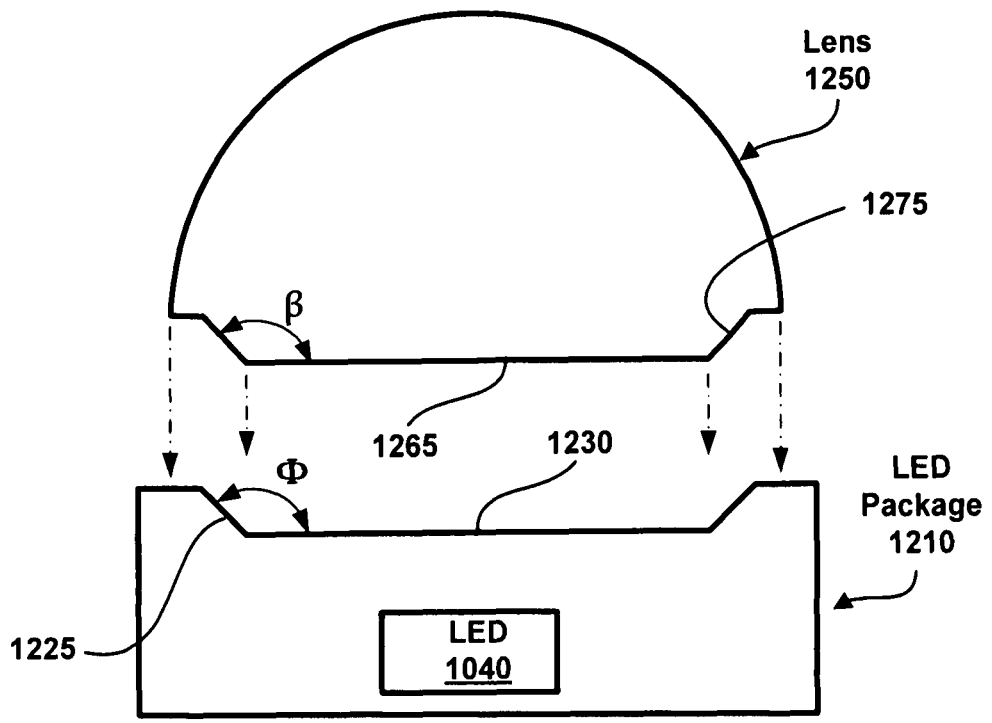
FIG. 12 is a cross-sectional view of an LED package and a lens prior to assembly in accordance with another embodiment of the present disclosure.
Figure 13:
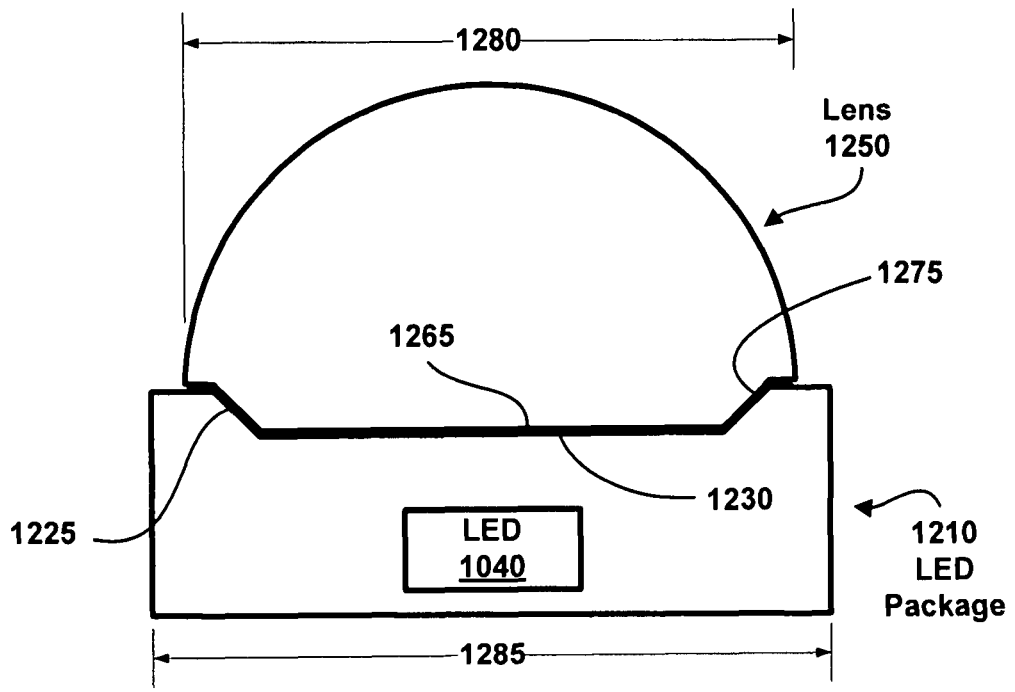
FIG. 13 is a cross-sectional view of the lens and LED package of FIG. 12 assembled, in accordance with another embodiment of the present disclosure.

FIGS. 12 and 13 show cross-sectional views of an LED package 1210 and a lens 1250 of the present disclosure. FIG. 12 is a cross-sectional view of the LED package 1210 and the lens 1250 prior to assembly and FIG. 13 is a cross-sectional view of the lens 1250 mounted to the LED package 1210. The sidewall 1225 defines an angle "Φ" with respect to a socket floor 1230, and a sidewall of the lens 1250 defines at an angle "β" with respect to a lower surface 1265. The angles Φ and β as illustrated in FIGS. 12 and 13 are about 135 degrees. However, the angles Φ and β can include a range of angles. For example, the range of angles can include about 90 degrees to about 140 degrees. In some embodiments, the angle Φ is the same as the angle β. When the angles Φ and β are less than 90 degrees, the lens sidewall 1275 and the socket sidewall 1225 can form an interference or "snap" fit. While the lens 1250 is illustrated in FIG. 13 as having a width 1280 that is less than a width 1285 of the LED package 1210, width 1280 of the lens 1250 can be greater than the width 1285 of the LED package 1210.

Figure 14:
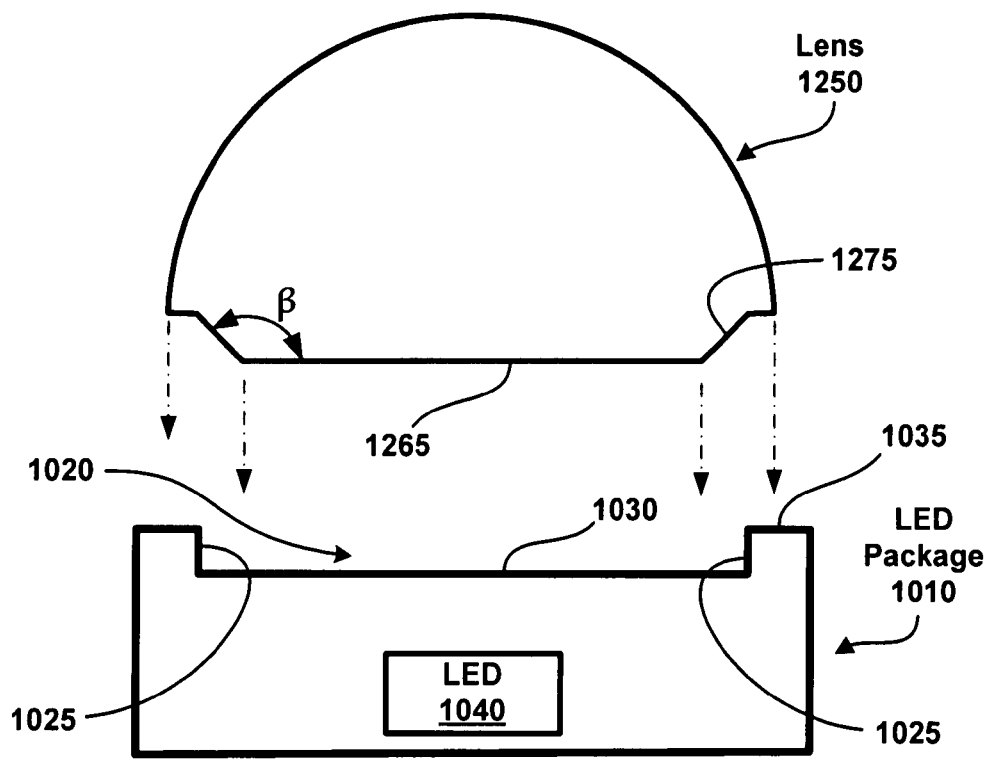
FIG. 14 is a cross-sectional view of an LED package and a lens prior to assembly in accordance with another embodiment of the present disclosure.
Figure 15:
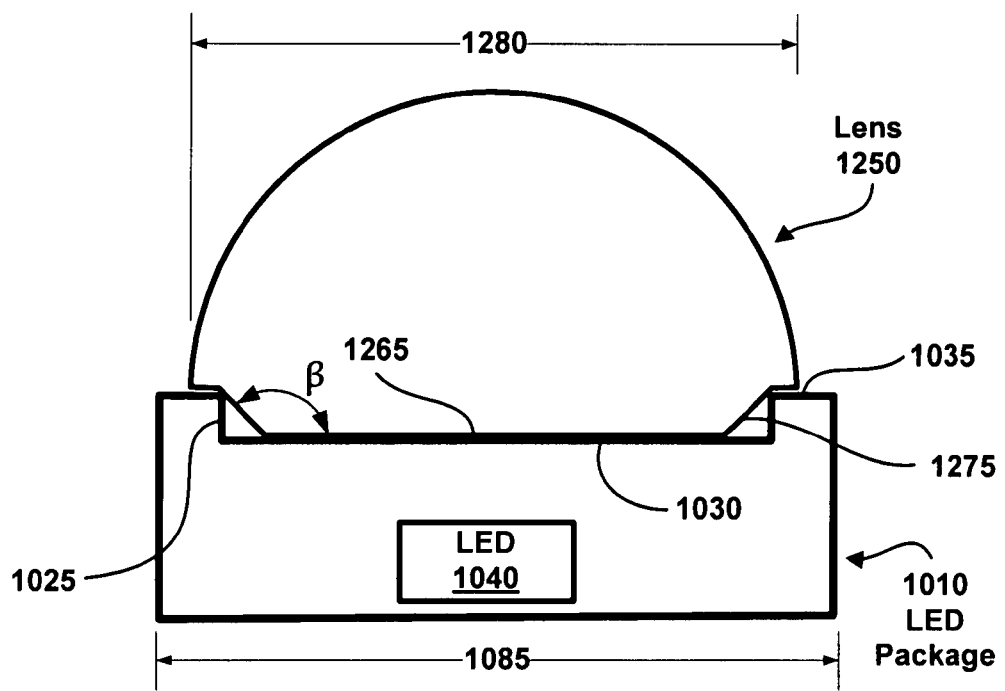
FIG. 15 is a cross-sectional view of the lens and LED package of FIG. 14 assembled, in accordance with another embodiment of the present disclosure.

FIGS. 14 and 15 show cross-sectional views of the LED package 1010 of FIG. 10 and lens 1250 of FIG. 12. FIG. 14 is a cross-sectional view of the LED package 1010 and the lens 1250 prior to assembly and FIG. 15 is a cross-sectional view of the lens 1250 mounted to the LED package 1010. As discussed elsewhere herein, the angle β includes a range of angles, for example, greater than 90 degrees to about 140 degrees. The inclined sidewall 1275 can accommodate horizontal misalignment between the lens 1250 and the LED package 1010 during assembly of the lens 1250 with the LED package 1010. For example, the inclined sidewall 1275 can guide the lens 1250 into place in the socket 1020 when using vacuum handling equipment to place the lens 1250, as discussed elsewhere herein. While the lens 1250 is illustrated in FIG. 15 as having a width 1280 that is less than the width 1085 of the LED package 1010, width 1280 of the lens 1250 can be greater than the width 1085 of the LED package 1010.

Figure 16:
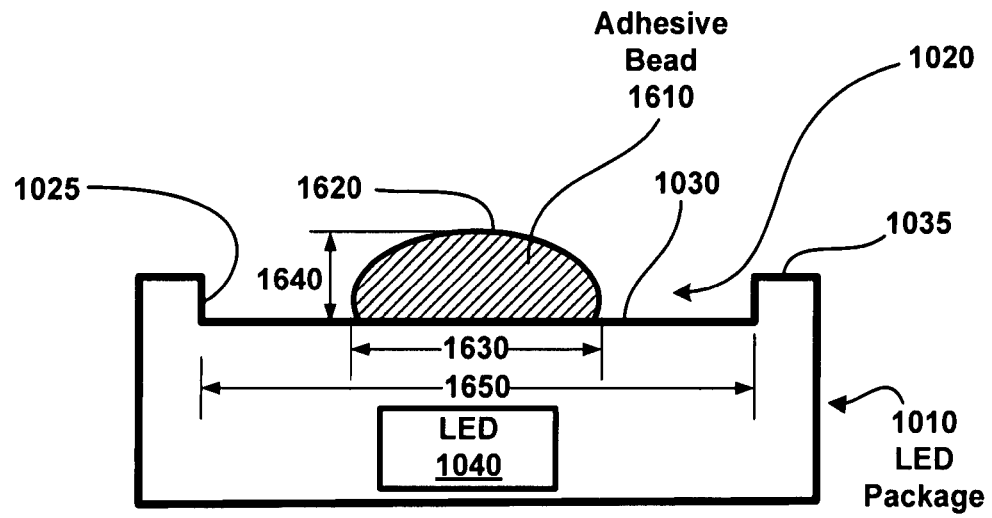
FIGS. 16-19 illustrate successive stages of bonding a lens to an LED package using an adhesive, in accordance with an embodiment of the present disclosure.

Air bubbles in a transparent, adhesive layer between the LED package 1010 and the lens 1050 can reduce the transparency of the adhesive layer. The number of air bubbles can be reduced by depositing an adhesive bead having a preferred shape and size on the LED package 1010. FIGS. 16-19 illustrate successive stages of bonding a lens 1050 to an LED package 1010. FIG. 16 is a cross-sectional view of an adhesive bead 1610 applied to an LED package 1010 before attaching the lens 1050. The adhesive bead 1610 is characterized by a convex bead surface 1620, a width 1630, and a height 1640. In some embodiments, the width 1630 of the adhesive bead 1610 is in a range of about 30 percent to about 50 percent of a width 1650 of the socket 1020. In some embodiments, the height 1640 of the adhesive bead 1610 is in a range of about 20 percent to about 35 percent of the width 1630 of the adhesive bead 1610. In some embodiments, the viscosity of the adhesive bead 1610 is in a range of about 2000 to 4000 centipoise.

The adhesive 1110 can be transparent to light in wavelengths emitted by the encapsulated LED 1040 and/or emitted by a luminescent layer within the LED package 1010. In some embodiments, the adhesive includes luminescent material and/or forms a luminescent layer. Other examples of adhesive properties include, an electrically conductive epoxy, a solder, a solder mixed with glass beads, a thermally conductive and electrically non-conductive epoxy, or a nano-carbon-fiber filled adhesive. Suitable adhesives include silicone, epoxy, etc. In some embodiments, a preformed ring including solder mixed with glass beads can be disposed on the top surface 1035 and form a hermetic seal between the LED package 1010 and the lens 1050, or between the LED package 1210 and the lens 1250, or between the LED package 1010 and the lens 1250.

Figure 17:
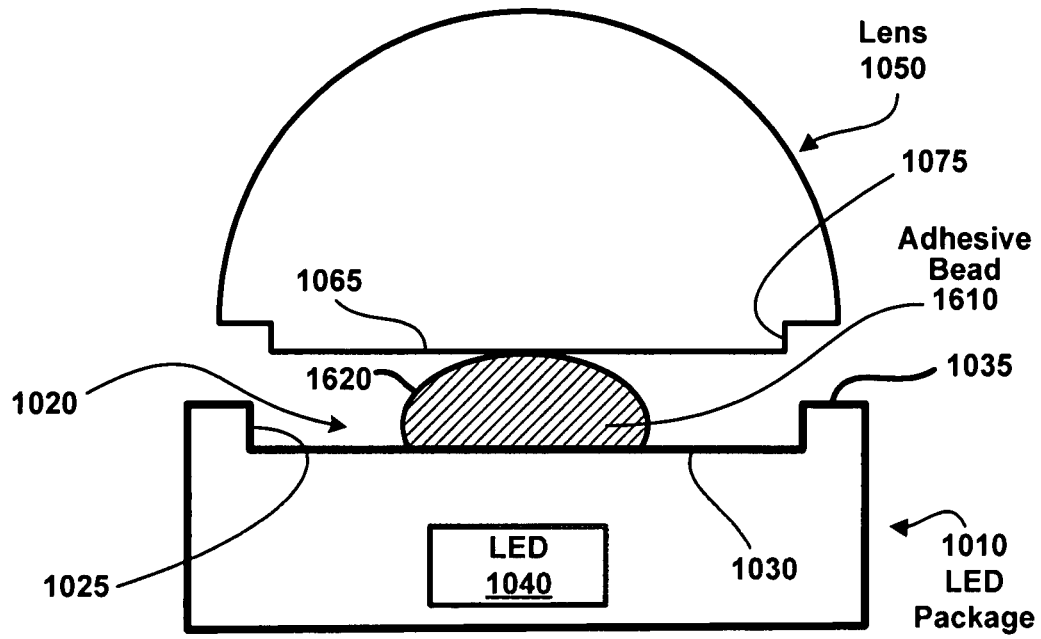
Figure 18:
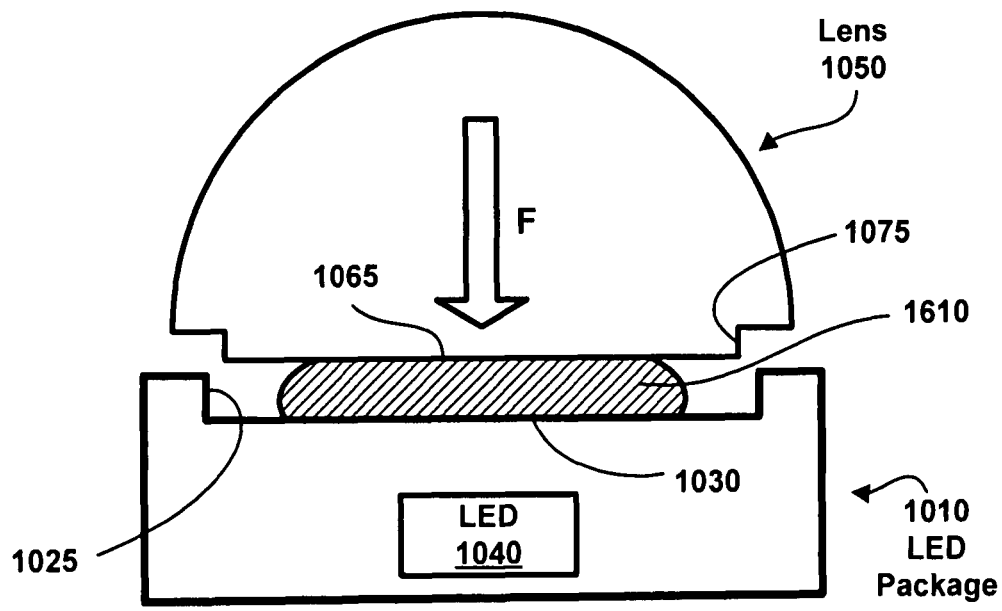

FIG. 17 is a cross-sectional view of the lens 1050 in contact with the adhesive bead 1610. In FIG. 17, the lower surface 1065 of the lens 1050 is illustrated making initial contact with the adhesive bead 1610 at a point at or near an apex of the convex bead surface 1620. FIG. 18 is a cross-sectional view of the lens 1050 applying a force to the adhesive bead 1610. The force "F" spreads the adhesive bead 1610 across the lower surface 1065 of the lens 1050 and the socket floor 1030 of the LED package 1010. Surface tension of the adhesive bead 1610 can combine with wetting of the lower surface 1065 of the lens 1050 (and the socket floor 1030 of the LED package 1010) to maintain the convex shape in the convex bead surface 1620 thereby reducing the likelihood of trapping air bubbles in the adhesive material.

Figure 19:
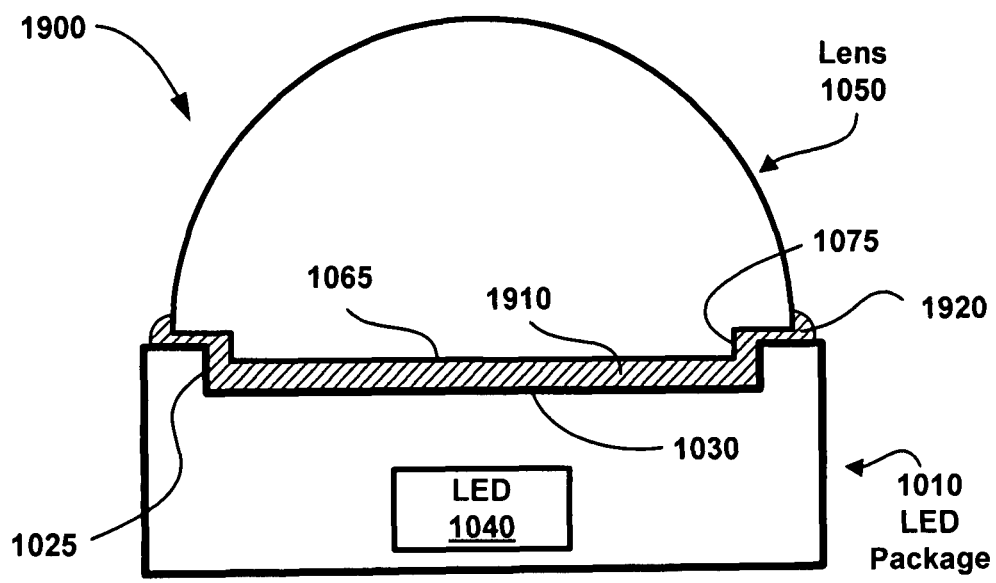

FIG. 19 is a cross-sectional view of an assembled light-emitting device 1900 including an adhesive layer 1910 between the lens 1050 and the LED package 1010. Excess adhesive material can form an adhesive fillet 1920 around the periphery of the lens 1050 as illustrated. While FIGS. 16-19 illustrate bonding a lens 1050 including a plug 1070 to an LED package 1010 including a socket 1020, in some embodiments, other mating surfaces may be used for the lens 1050 and the LED package 1010. For example, the lens 1050 can include a generally flat surface that omits the plug 1070 and the LED package 1010 can include a generally flat surface that omits the socket 1020.

As discussed elsewhere herein, a lens can be formed by injection molding. In this process a mold having a lens-shaped well is sealed to an LED package having a socket. A suitable material, e.g., a plastic in a fluid state, is injected into the mold to fill the well and the socket. The injected material is then cured to form the lens. The process can be performed as a batch process on an array of LED packages, using a mold having an array of lens shaped wells.

Figure 20:
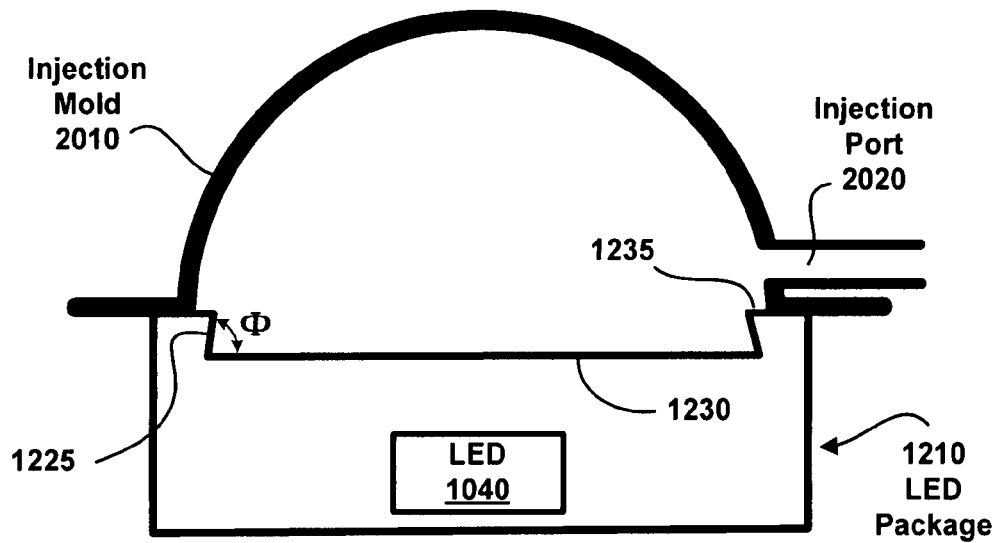
FIGS. 20-21 illustrate successive steps in fabricating a lens using an injection mold in accordance with an embodiment of the present disclosure.
Figure 21:
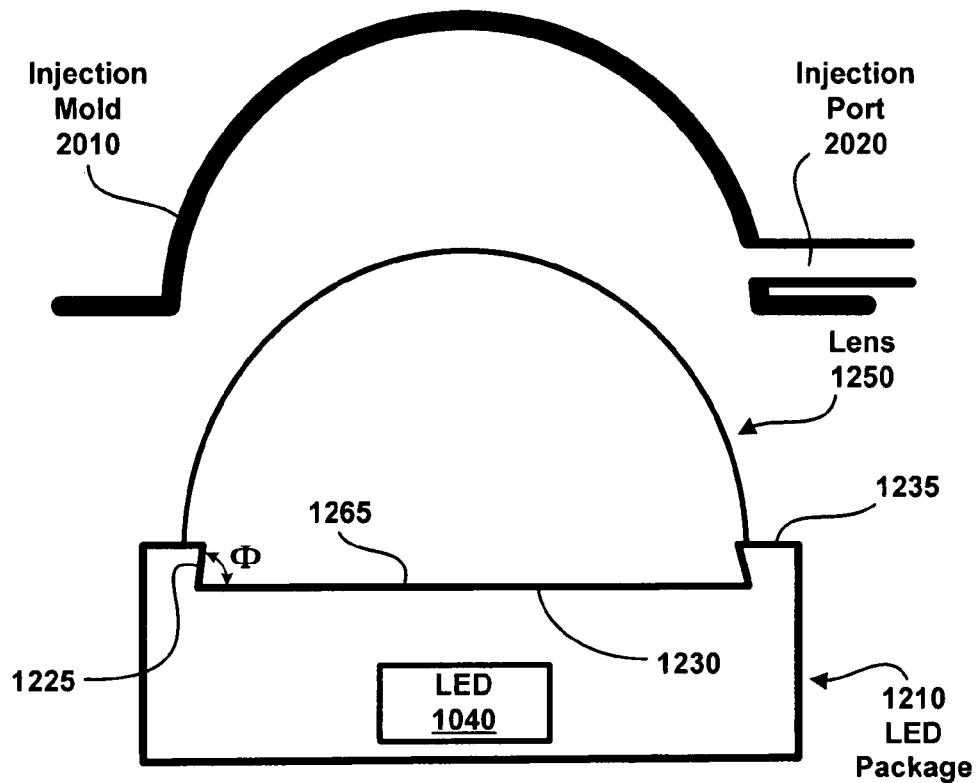

FIGS. 20-21 illustrate successive steps in fabricating a lens using an injection mold. FIG. 20 is a cross-sectional view of a mold 2010 sealed to an LED package 1210 prior to injection of a fluid lens material. The mold 2010 includes an injection port 2020 configured to admit the lens material such as a plastic, silicone, or epoxy, configured to cure to a solid shape. The LED package 1210 and the mold 2010 combine to form an injection mold.

FIG. 21 is a cross-sectional view of a completed LED device including a molded lens 1250 after the mold 2010 has been separated from the LED package 1210. The sidewall of the LED package 1210 is inclined at an angle Φ. The angle Φ between the sidewall 1225 and the socket floor 1230 is illustrated as less than 90 degrees, which provides an inference between the lens 1250 and the LED package 1210. However, the angle Φ can include other angles, for example a range from about less than 90 degrees to about 140 degrees. The angle Φ is illustrated in FIGS. 20 and 21 as being fabricated using molding techniques. However other methods of fabrication can be employed to achieve an angle Φ less than 90 degrees.

Figure 22:
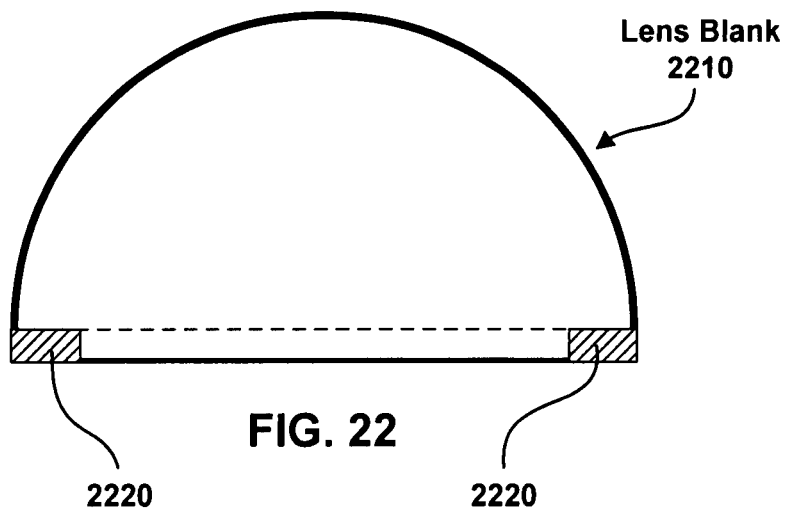
FIG. 22 is a cross-sectional view of an exemplary embodiment of a lens blank of the present disclosure.
Figure 23:
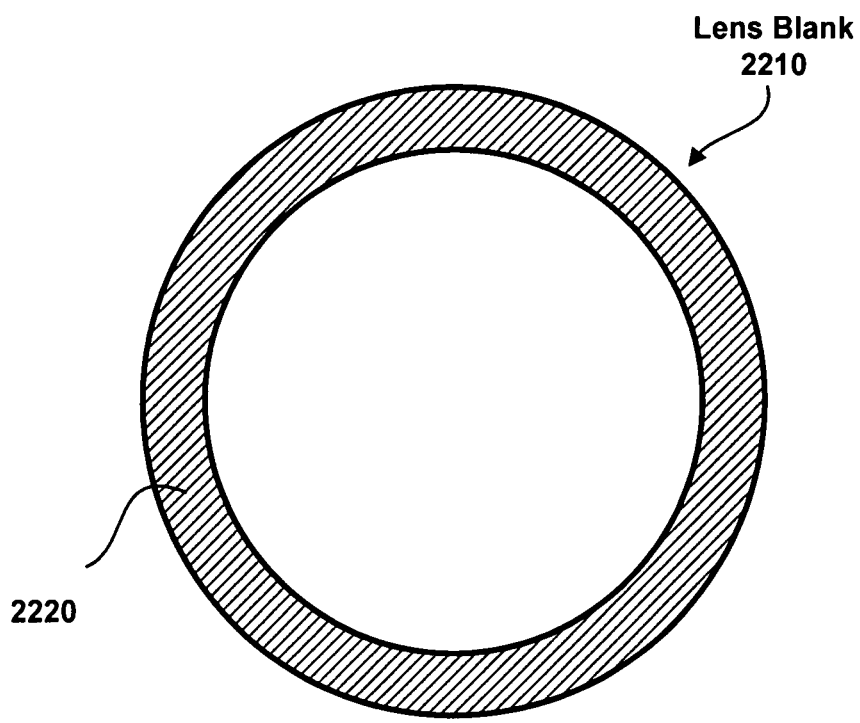
FIG. 23 is a bottom plan view of the lens blank of FIG. 22, in accordance with an embodiment of the present disclosure.
Figure 24:
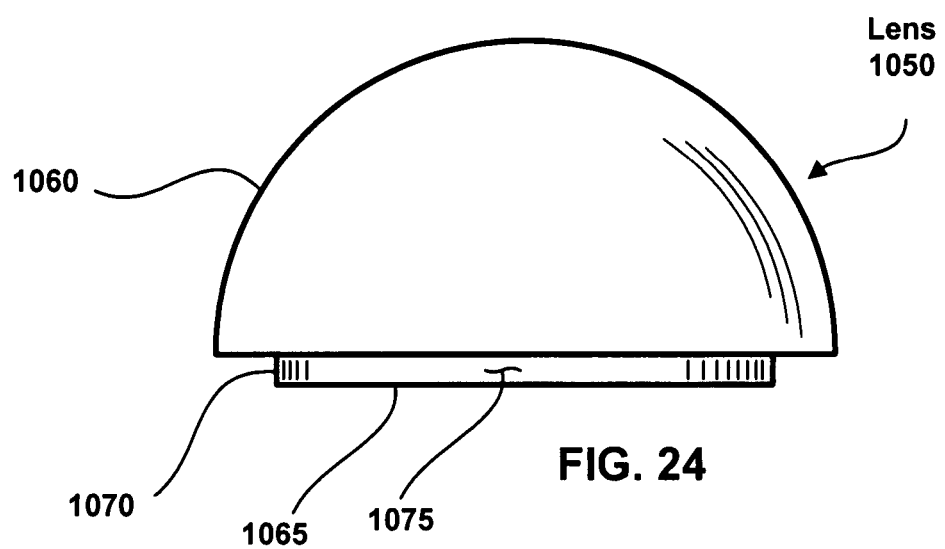
FIG. 24 is a side elevation of a lens machined from the lens blank of FIG. 22, in accordance with an embodiment of the present disclosure.

Another method of manufacturing a lens includes forming a lens blank and then machining the blank to remove excess material. For example, a glass blank can be turned to remove material to form the plug. FIG. 22 is a cross-sectional view of an exemplary embodiment of a lens blank 2210 prior to machining, and FIG. 23 is a bottom plan view of the lens blank 2210. FIG. 24 is a front elevation illustrating the resulting lens 1050. In some embodiments, the lens blank 2210 is formed by molding, e.g., injection molding. Alternatively, the lens blank 2210 can be cast. In various embodiments, the lens blank 2210 is fabricated from materials including glass, plastic, silicone, epoxy, etc.

The lens blank 2210, as illustrated, is a hemisphere having radial symmetry. Other suitable shapes having radial symmetry include a circular cylinder, a spherical section, a concave spherical section, etc. A plug 1070 is formed by removing the material in an annular volume defined by a region 2220 as illustrated in FIGS. 22 and 23. The lens blank 2210 in FIG. 22 includes a region 2220 of material, which can be removed to fabricate the lens 1050 from the lens blank 2210. When the lens blank 2210 has radial symmetry, the material can be removed by turning the lens blank 2210. Alternatively, the material in the region 2220 can be removed by grinding. In other examples, when the lens blank 2210 does not have radial symmetry, the material in the region 2220 can be removed, for example, by using an endmill.

Figure 25:
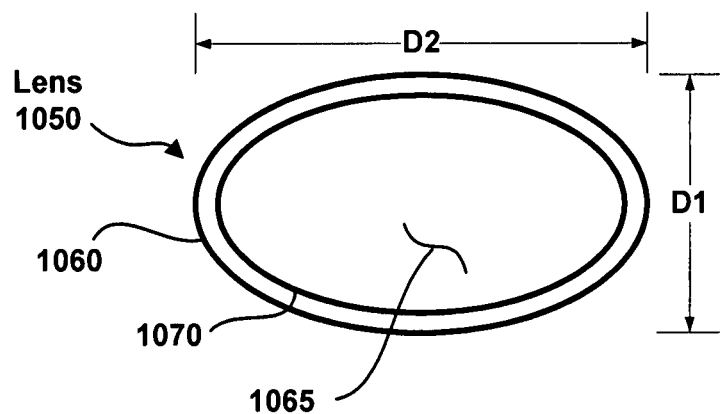
FIG. 25 is a bottom plan view of the lens of FIG. 24, in accordance with another embodiment of the present disclosure.
Figure 26:
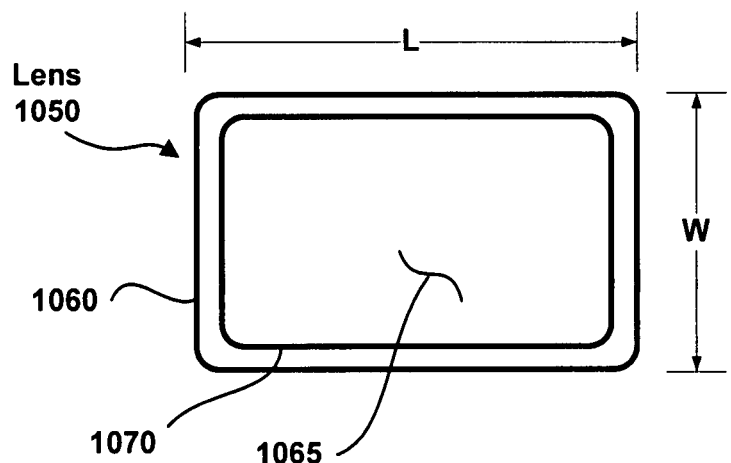
FIG. 26 is a bottom plan view of the lens of FIG. 24, in accordance with another embodiment of the present disclosure.

FIGS. 25-26 show bottom plan views illustrating alternative shapes for the lens 1050. FIG. 25 illustrates a generally oval shape for the lens 1050. The oval shape for lens 1050 has a diameter D1 in a minor axis, and a diameter D2 in a major axis. The diameter D2, as illustrated, is greater than the diameter D1. In some embodiments, the ratio of the diameter D1 to the diameter D2 is about 3 to 4, reflecting an aspect ratio of a standard television screen. In another embodiment, the ratio of the diameter D1 to the diameter D2 is about 9 to 16, reflecting an aspect ratio of a wide screen television. Other ratios of the diameter D1 to the diameter D2 can be employed. Moreover, the lens 1050 can be fabricated in other shapes of varying complexity, for example a hexagon. The lens 1250 can also be described by shapes similar to those illustrated in FIGS. 22 and 23 including an allowance for the inclined sidewall 1275.

FIG. 26 illustrates a generally rectangular shape for the lens 1050, having a width "W" and a length "L." In some embodiments, the ratio of the width "W" to the length "L" is about 3 to 4, reflecting an aspect ratio of a standard television screen. In another embodiment, the ratio of the width "W" to the length "L" is about 9 to 16, reflecting an aspect ratio of a wide screen television. Other ratios of the width "W" to the length "L" can be achieved. In various embodiments, the aspect ratio of the lens 1050 and/or shape of the cap 1060 can be configured to shape a beam light, for example, for use in a projector or a headlight of an automobile.

Figure 27:
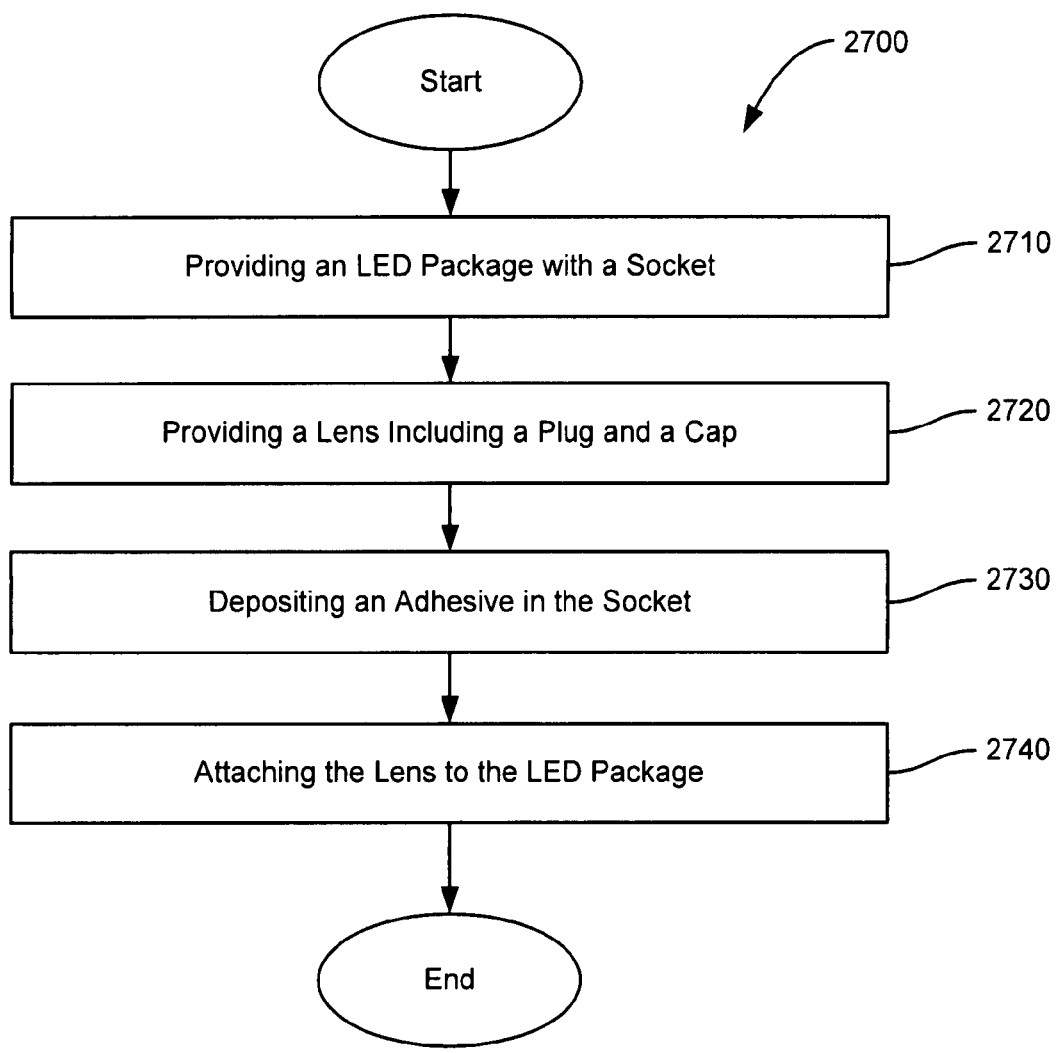
FIG. 27 is a flowchart for a method according to an exemplary embodiment of the invention.

FIG. 27 depicts an exemplary method 2700 for fabricating a light-emitting device. The method 2700 comprises a step 2710 of providing an LED package with a socket, a step 2720 of providing a lens including a plug and a cap, an optional step 2730 of depositing an adhesive in the socket, and a step 2740 of attaching the lens to the LED package. In those embodiments in which the method 2700 is directed to mechanically securing the lens in an LED package, the step 2730 is omitted and the resulting light-emitting device does not include an adhesive layer.

Figure 28:
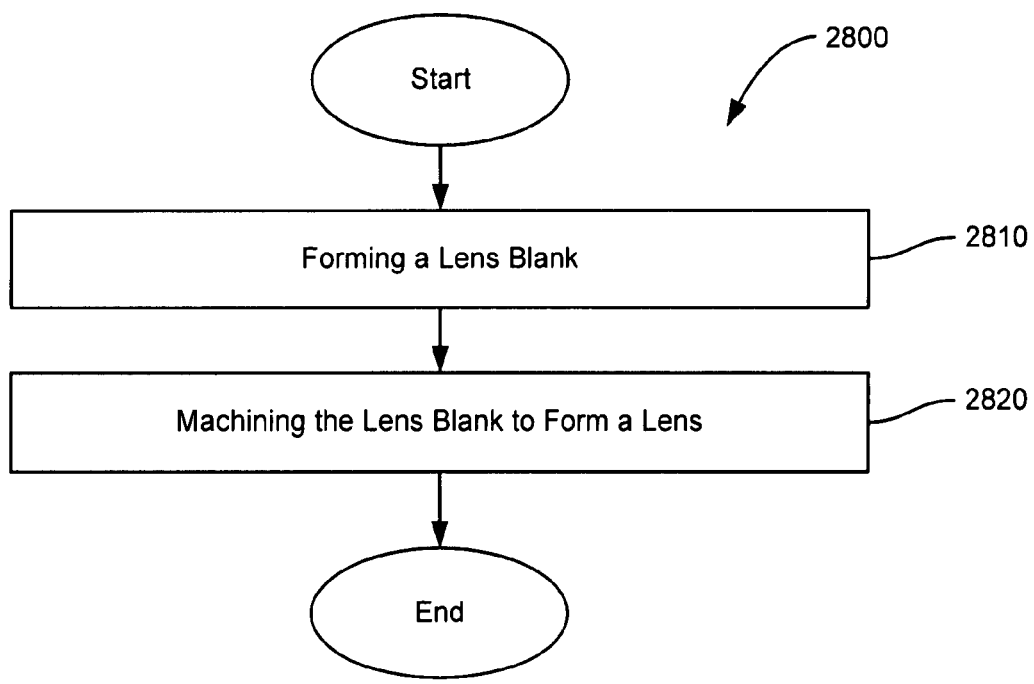
FIG. 28 is a flowchart for a method according to an exemplary embodiment of the invention.

FIG. 28 depicts a method 2800 for fabricating a lens. The method 2800 comprises a step 2810 of forming a lens blank, and a step 2820 of machining the lens blank to form the lens. In some embodiments, the lens blank is formed from glass, and the lens blank is turned to remove material from an annular region to form the plug.

Figure 29:
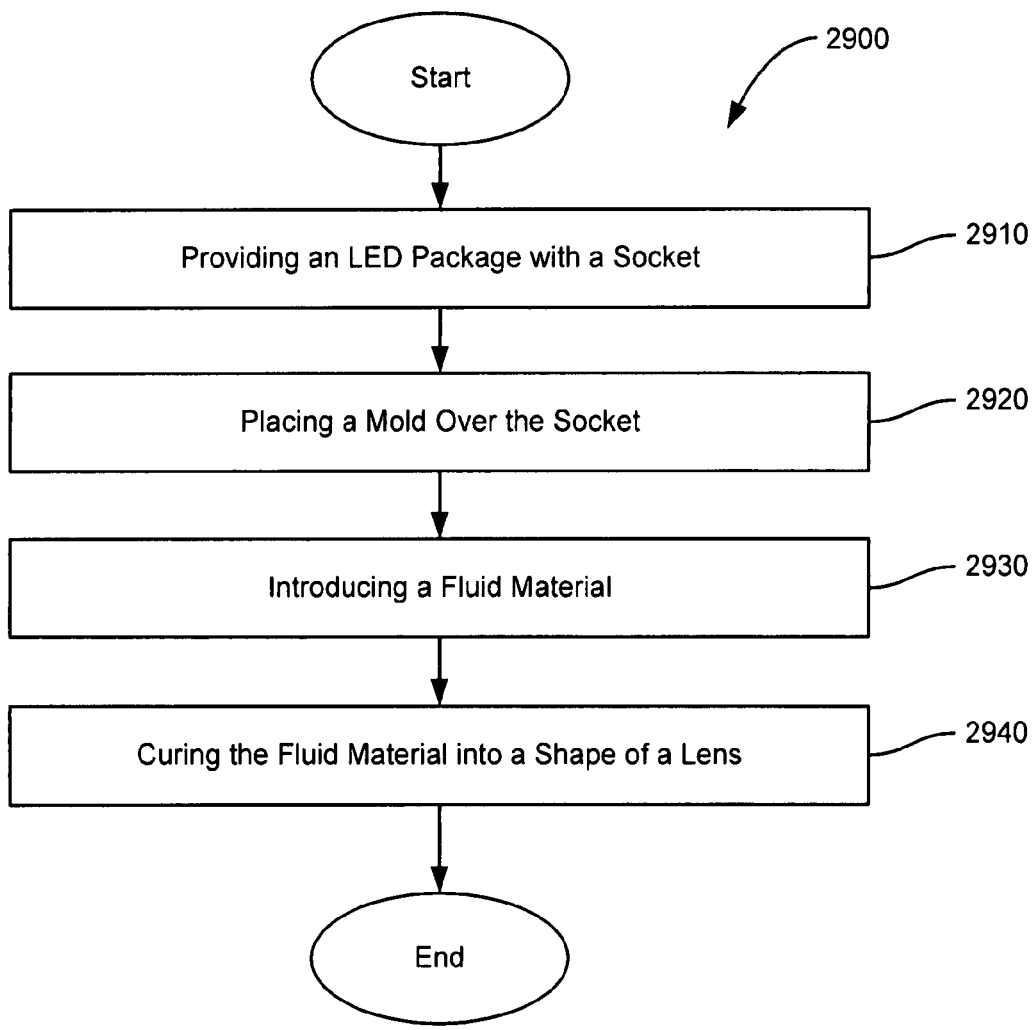
FIG. 29 is a flowchart for a method according to an exemplary embodiment of the invention.

FIG. 29 depicts a method 2900 for molding a lens. The method 2900 comprises a step 2910 of providing an LED package with a socket, a step 2920 of placing a mold over the socket, a step 2930 of introducing a fluid material into the mold, and a step 2940 of curing the fluid material into a shape of the lens.

Figure 30:
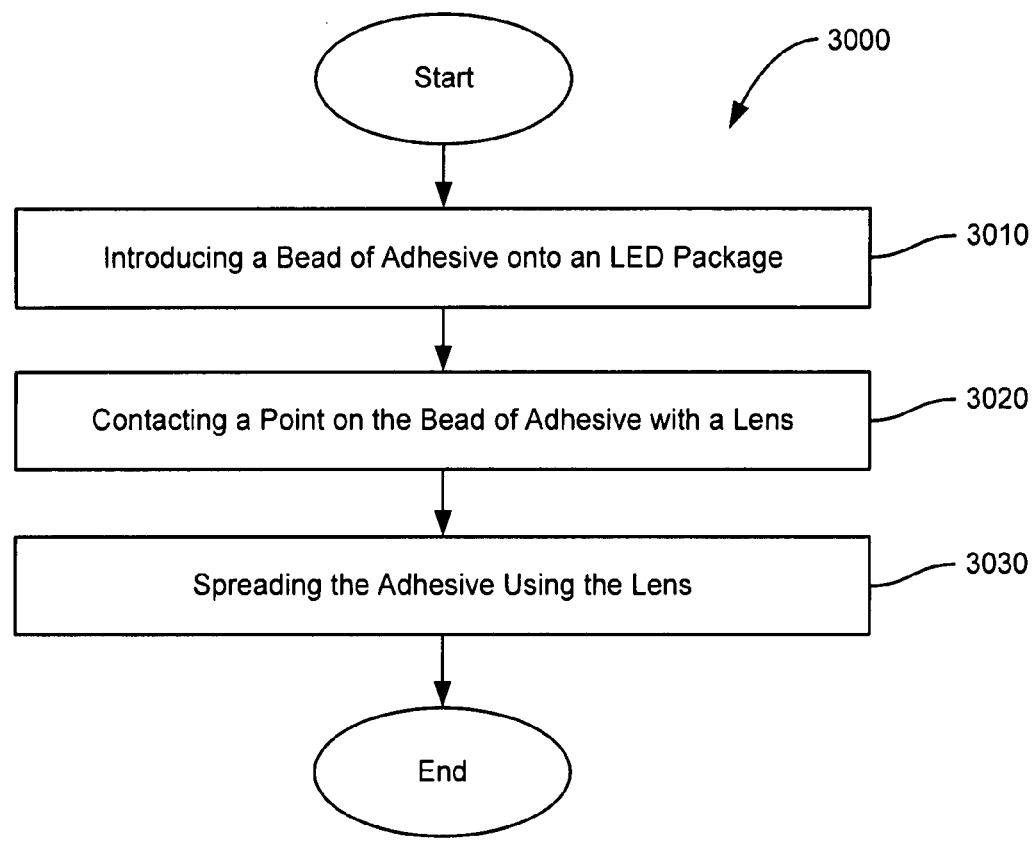
FIG. 30 is a flowchart for a method according to an exemplary embodiment of the invention.

FIG. 30 depicts a method 3000 for forming an adhesive layer between a lens and an LED package. The method 3000 comprises a step 3010 of introducing a bead of adhesive onto the LED package, a step 3020 of contacting a point on the bead of adhesive with the lens, and a step 3030 of spreading the adhesive using the lens. Although FIGS. 10-26 illustrate lenses having a plug and FIGS. 10-21 illustrate LED packages having a socket it will be understood that an adhesive layer may be formed between other mating surfaces using the method 3000. For example, a lens and an LED package may each include a substantially flat mating surface.

In the foregoing specification, the present invention is described with reference to specific embodiments thereof, but those skilled in the art will recognize that the present disclosure is not limited thereto. Various features and aspects of the above-described invention may be used individually or jointly. Further, the present invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art. It will be further recognized that "LED" and "LED die" are used interchangeably herein.

What is claimed is:

1. A light-emitting device comprising:
a package including:
a light-emitting side,
a top surface,
a socket including a socket sidewall and a bottom surface, the socket sidewall disposed between the top surface and the bottom surface of the package, the socket disposed on the light-emitting side of the package;
a cavity having a floor and configured to transmit light to the light emitting side of the package via the socket;
an LED disposed within the cavity and bonded to the floor of the cavity;
a thermal insulation layer disposed within the cavity between the LED and the top surface of the package; and
a luminescent layer within the cavity between the thermal insulation layer and the top surface of the package;
a class lens including a cap and a plug, the cap including an upper surface and a lower surface, the plug including a lower surface and a plug sidewall between the lower surface of the plug and the lower surface of the cap, the plug disposed within the socket and the lower surface of the cap disposed adjacent the top surface of the package; and
an adhesive layer disposed to attach the lower surface of the cap to the top surface of the package, wherein a portion the adhesive layer is disposed between the luminescent layer and the lower surface of the plug.

2. The light-emitting device of claim 1, wherein an angle defined between the socket sidewall and the bottom surface of the socket is less than 90 degrees.

3. The light-emitting device of claim 1, wherein an angle defined between the plug sidewall and the lower surface of the plug is different from an angle defined between the socket sidewall and the bottom surface of the socket.

4. The light-emitting device of claim 1, wherein an angle defined between the socket sidewall and the bottom surface of the socket is about 90 degrees, and an angle defined between the plug sidewall and the lower surface of the plug is greater than 90 degrees.

5. The light-emitting device of claim 1, wherein the floor is fabricated from aluminum nitride, the aluminum nitride having a width in a direction parallel to the top surface that is at least as wide as the top surface, the aluminum nitride having a thickness between 0.2 and 0.4 mm.

6. The light-emitting device of claim 1, wherein the thermal insulation layer includes a material having a thermal conductivity below 0.5 watts/meter-Kelvin.

7. The light-emitting device of claim 1, wherein the top surface includes an alignment layer.

8. The light-emitting device of claim 1, wherein the lens includes a first diameter and a second diameter, the second diameter greater than the first diameter.

9. The light-emitting device of claim 8, wherein a ratio of the first diameter to the second diameter is about 9 to 16.

10. The light-emitting device of claim 1, wherein the lower surface of the plug has a larger radius than a radius at the intersection of the plug sidewall and the lower surface of the cap.

11. The light-emitting device of claim 1, wherein a shape of the cap includes a Fresnel surface.

12. The light-emitting device of claim 1, wherein the thermal insulation layer does not include luminescent material.

13. The light-emitting device of claim 1, wherein the cavity further includes a protective capping layer between the luminescent layer and the top surface.

14. The light-emitting device of claim 2, wherein an angle defined between the plug sidewall and the lower surface of the plug is greater than 90 degrees, the lower surface of the plug has a first width, and the top of the socket sidewall has a second width greater than the first width for guiding the lens into the socket.

15. The light-emitting device of claim 1, wherein an angle defined between the plug sidewall and the lower surface of the plug is less than 90 degrees.

16. The light-emitting device of claim 1, wherein the plug sidewall and the socket sidewall form an interference fit.

17. The light-emitting device of claim 1, wherein the package comprises a ceramic material.

18. A light-emitting device comprising:
a package including:
a light-emitting side,
a top surface,
a socket including a socket sidewall and a bottom surface, the socket sidewall disposed between the top surface and the bottom surface of the package, the socket disposed on the light-emitting side of the package;
a cavity having a floor and configured to transmit light to the light emitting side of the package via the socket;
an LED disposed within the cavity and bonded to the floor of the cavity;
an encapsulation layer disposed within the cavity between the LED and the top surface of the package; and
a glass lens including a cap and a plug, the cap including an upper surface and a lower surface, the plug including a lower surface and a plug sidewall between the lower surface of the plug and the lower surface of the cap, the plug disposed within the socket and the lower surface of the cap disposed adjacent the top surface of the package; and
an adhesive layer disposed to attach the lower surface of the cap to the top surface of the package, wherein a portion the adhesive layer is disposed between the encapsulation layer and the lower surface of the plug.

19. The light-emitting device of claim 18, wherein a portion the adhesive layer is disposed between the lower surface of the cap and the top surface of the package.

20. The light-emitting device of claim 18, wherein a portion the adhesive layer is disposed between the sidewall of the cap and the sidewall of the socket.

21. The light-emitting device of claim 18, lower surface of the cap is a flat surface, and the top surface of the package is a flat surface.

22. The light-emitting device of claim 18, wherein a portion the adhesive layer is disposed between the encapsulation layer and the lower surface of the plug.

23. The light-emitting device of claim 18, wherein the encapsulation layer comprises a thermal insulation layer.

24. The light-emitting device of claim 17, wherein the encapsulation layer comprises a luminescent layer.

25. The light-emitting device of claim 17, wherein the package comprises a ceramic material.

* * * * *